United States Patent
Smith et al.

(10) Patent No.: US 7,136,144 B2
(45) Date of Patent: Nov. 14, 2006

(54) METHOD AND APPARATUS FOR SELF-REFERENCED DYNAMIC STEP AND SCAN INTRA-FIELD LENS DISTORTION

(75) Inventors: Adlai H. Smith, Escondido, CA (US); Robert O. Hunter, Jr., Snowmass Village, CO (US); Bruce B. McArthur, San Diego, CA (US)

(73) Assignee: Litel Instruments, San Diego, CA (US)

( * ) Notice: Subject to any disclaimer, the term of this patent is extended or adjusted under 35 U.S.C. 154(b) by 0 days.

(21) Appl. No.: 11/289,112

(22) Filed: Nov. 28, 2005

(65) Prior Publication Data

US 2006/0109438 A1    May 25, 2006

Related U.S. Application Data

(63) Continuation-in-part of application No. 10/869,270, filed on Jun. 15, 2004, now Pat. No. 6,975,382, which is a continuation of application No. 10/252,020, filed on Sep. 20, 2002, now Pat. No. 6,906,780.

(60) Provisional application No. 60/323,571, filed on Sep. 20, 2001.

(51) Int. Cl.
*G03B 27/68* (2006.01)
*G03B 27/42* (2006.01)

(52) U.S. Cl. .......................... 355/52; 355/53

(58) Field of Classification Search .................. 355/52, 355/53, 55, 67, 77; 250/548; 356/124, 399–401
See application file for complete search history.

(56) References Cited

U.S. PATENT DOCUMENTS

| | | | |
|---|---|---|---|
| 4,861,148 A | 8/1989 | Santo et al. | |
| 5,285,236 A | 2/1994 | Jain | |
| 5,402,224 A | 3/1995 | Hirukawa et al. | |
| 5,438,413 A | 8/1995 | Mazor et al. | |
| 5,615,006 A | 3/1997 | Hirukawa et al. | |
| 5,757,507 A | 5/1998 | Ausschnitt et al. | |
| 5,877,861 A | 3/1999 | Ausschnitt et al. | |
| 5,894,350 A | 4/1999 | Hsieh et al. | |
| 5,898,478 A * | 4/1999 | Yim et al. ................. 355/53 |
| 6,079,256 A | 6/2000 | Bareket | |
| 6,143,621 A | 11/2000 | Tzeng et al. | |
| 6,153,886 A | 11/2000 | Hagiwara et al. | |
| 6,204,912 B1 | 3/2001 | Tsuchiya et al. | |
| 6,259,525 B1 | 7/2001 | David | |
| 6,734,971 B1 * | 5/2004 | Smith et al. ............. 356/401 |
| 6,906,780 B1 * | 6/2005 | Smith ....................... 355/52 |
| 2002/0071112 A1 | 6/2002 | Smith et al. | |

OTHER PUBLICATIONS

Lin, B.J., "The Attenuated Phase-Shifting Mask", Solid State Technology, Special Series/Advanced Lithography, 35(1):43-47, (Jan. 1992).

(Continued)

*Primary Examiner*—Henry Hung Nguyen

(57) ABSTRACT

A reticle stage grid and yaw in a projection imaging tool is determined by exposing a first portion of a reticle pattern onto a substrate with a recording media thereby producing a first exposure. The first portion of the reticle pattern includes at least two arrays of alignment attribute that have features complementary to each other. The reticle stage is then shifted and a second portion of the reticle pattern is exposed. The first and second exposures overlap and interlock to create completed alignment attributes. Measurements of positional offsets of the completed alignment attributes are used to determine the reticle stage grid and yaw.

15 Claims, 29 Drawing Sheets

OTHER PUBLICATIONS

Armitage et al., "Analysis of Overlay Distortion Patterns", Proc. SPIE, 921:207-221 (1988).

Bjorkholm et al., "Reduction Imaging at 14 nm Using Multilayer-Coated Optics: Printing of Features Smaller than 0.1 μm", J. Vac. Sci. Technol. B., 8(6):1509-1543 (1990).

Bruning et al., "Optical Lithography—Thirty Years and Three Orders of Magnitude", Proc. SPIE, 3051:14-27 (1997).

Brunner, T.A., "Impact of Lens Aberrations on Optical Lithography", IBM J. Res. and Devel.: Optical Lithography, 41(1-2):57-67 (1997). Reprint submitted, pp. 1-27.

Cote et al., "Microscan◊ III-Performance of a Third Generation, Catadioptric Step and Scan Lithographic Tool", Proc. SPIE, 3051:806-816 (1997).

DeJule, R., "Mix and Match: A Necessary Choice", Semiconductor International, 23(2):66-76 (2000).

Dooly et al., "Stepper Matching for Optimum Line Performance", Proc. SPIE, 3051:426-432 (1997).

Goodwin et al., "Characterizing Overlay Registration of Concentric 5X and 1X Stepper Exposure Fields Using Interfield Data", Proc. SPIE, 3050:407-417 (1997).

Zavecz, T.E., "Machine Models and Registration", SPIE Critical Reviews of Optical Science and Technology, CR52:134-159 (1994).

Handbook of Microlithography, Micromachining and Microfabrication, Book: vol. 1, "Microlithography", Rai-Choudhury, P. (Ed.)., SPIE Optical Engineering Press, Proc. SPIE, Bellingham, Washington, pp. 417-418 (1997).

Hasan et al., "Automated Electrical Measurements of Registration Errors in Step-and-Repeat Optical Lithography Systems", IEEE Transactions on Electron Devices, ED27(12):2304-2312 (1980).

KLA 5105, "Linewidth and Misregistration System", KLA 5105 Product Specification, KLA Instruments Corporation, 2 pages (1995).

KLA 5200, "Value-added Overlay Metrology for Advanced Lithography", KLA 5200 Product Specifications, KLA Instruments Corporation, 2 pages, (1996).

Kodama et al., "Measuring System XY-5i", Proc. SPIE, 2439:144-155 (1995).

Leica LMS IPRO, "Fully Automated Mask and Wafer Metrology System", Leica, pamphlet pp. 1-5.

MacMillen et al., "Analysis of Image Field Placement Deviations of a 5X Microlithographic Reduction Lens", SPIE, 334:78-89 (1982).

Martin et al., "Measuring Fab Overlay Programs", Proc. SPIE, 3677:64-71 (1999).

McFadden et al., "A Computer Aided Engineering Workstation for Registration Control", Proc. SPIE, 1087:255-266 (1989).

Mulkens et al., "ArF Step and Scan Exposure System for 0.15 μm Technology Node?", Proc. SPIE, 3679:506-521 (1999).

Newnam et al., "Development of XUV Projection Lithograph at 60-80 nm", Proc. SPIE, 1671:419-436 (1992).

Numerical Recipes, "The Art of Scientific Computing", Press et al., (Eds.), Cambridge University Press, New York, pp. 52-64 (1990).

Pellegrini, J.C., "Comparisons of Six Different Intrafield Control Paradigms in an Advanced Mix-and-Match Environment", Proc. SPIE, 3050:398-406 (1997).

Pellegrini et al., "Super Sparse Overlay Sampling Plans: An Evaluation of Methods and Algorithms for Optimizing Overlay Quality Control and Metrology Tool Throughput", Proc. SPIE, 3677:72-82 (1999).

Preil et al., "A New Approach to Correlating Overlay and Yield", Proc. SPIE, 3677:208-216 (1999).

Quaestor Q7, "Fully Automated Optical Metrology System for Advanced IC Production", Quaestor Q7 Product Specification, BIO-RAD, 2 pages.

Raugh, M.R., "Error Estimation for Lattice Methods of State Self-Calibration", Proc. SPIE, 3050:614-625 (1997).

Sullivan, N.T., "Semiconductor Pattern Overlay", Proc. SPIE Critical Reviews of Optical Science and Technology, CR52:160-188 (1994).

Takac et al., "Self-Calibration in Two-Dimensions: The Experiment", Proc. SPIE, 2725:130-146 (1996).

van den Brink et al., "Direct-Referencing Automatic Two-Points Reticle-to-Wafter Alignment Using a Projection Column Servo System", Proc. SPIE, 633:60-71 (1986).

van den Brink et al., "Matching Management of Multiple Wafer Steppers Using a Stable Standard and a Matching Simulator", Proc. SPIE, 1087:218-232 (1989).

van den Brink et al., "Matching of Multiple Wafer Steppers for 0.35 μm Lithography Using Advanced Optimization Schemes", Proc. SPIE, 1926:188-207 (1993).

van den Brink et al., "Matching Performance for Multiple Wafer Steppers Using an Advanced Metrology Procedure", Proc. SPIE, 921:180-197 (1988).

van den Brink et al., "New 0.54 Aperture i-Line Wafer Stepper with Field by Field Leveling Combined with Global Alignment", Proc. SPIE, 1463:709-724 (1991).

van Schoot et al., "0.7 NA DUV Step & Scan System for 150nm Imaging with Improved Overlay", Proc. SPIE, 3679:448-463 (1999).

Yost et al., "Lens Matching and Distortion Testing in a Multi-Stepper, Sub-Micron Environment", Proc. SPIE, 1087:233-244 (1989).

Zavecz et al., "Life Beyond Mix-and-Match: Controlling Sub-0.18 μm Overlay Errors", Semiconductor International, 23(8):205,206,208,210,212 and 214 (2000).

* cited by examiner

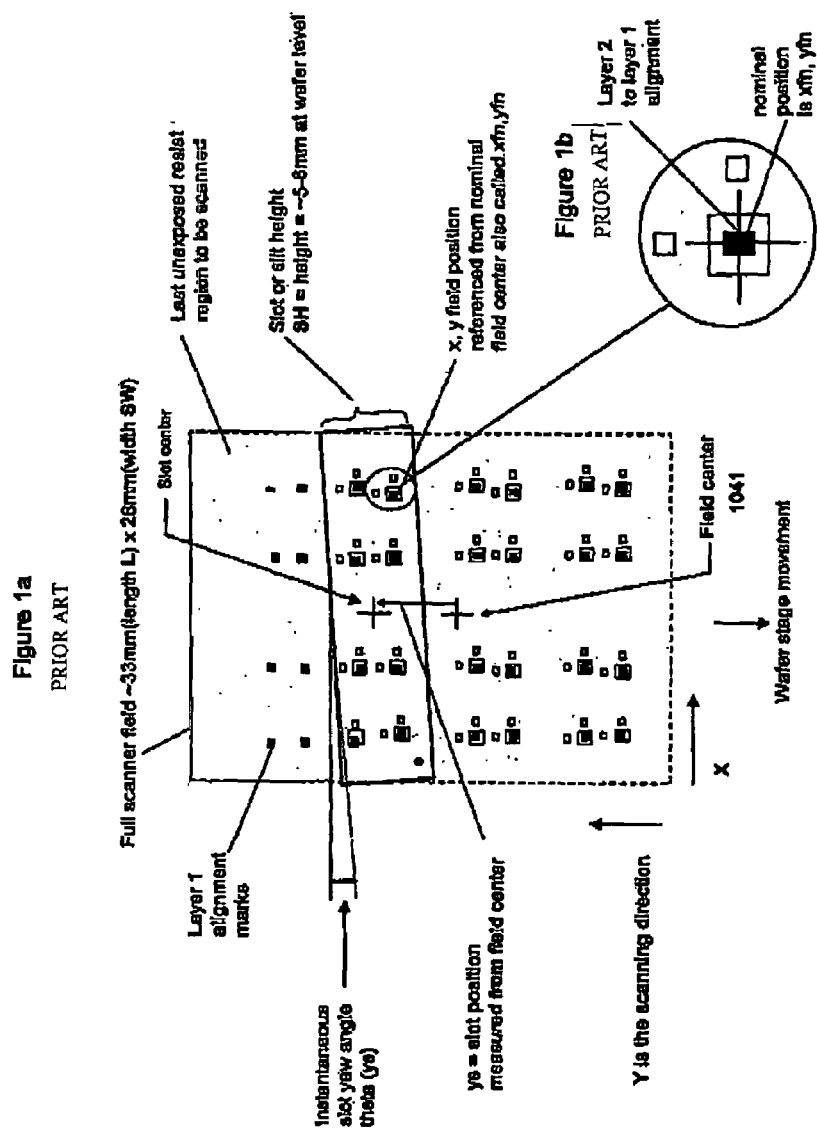

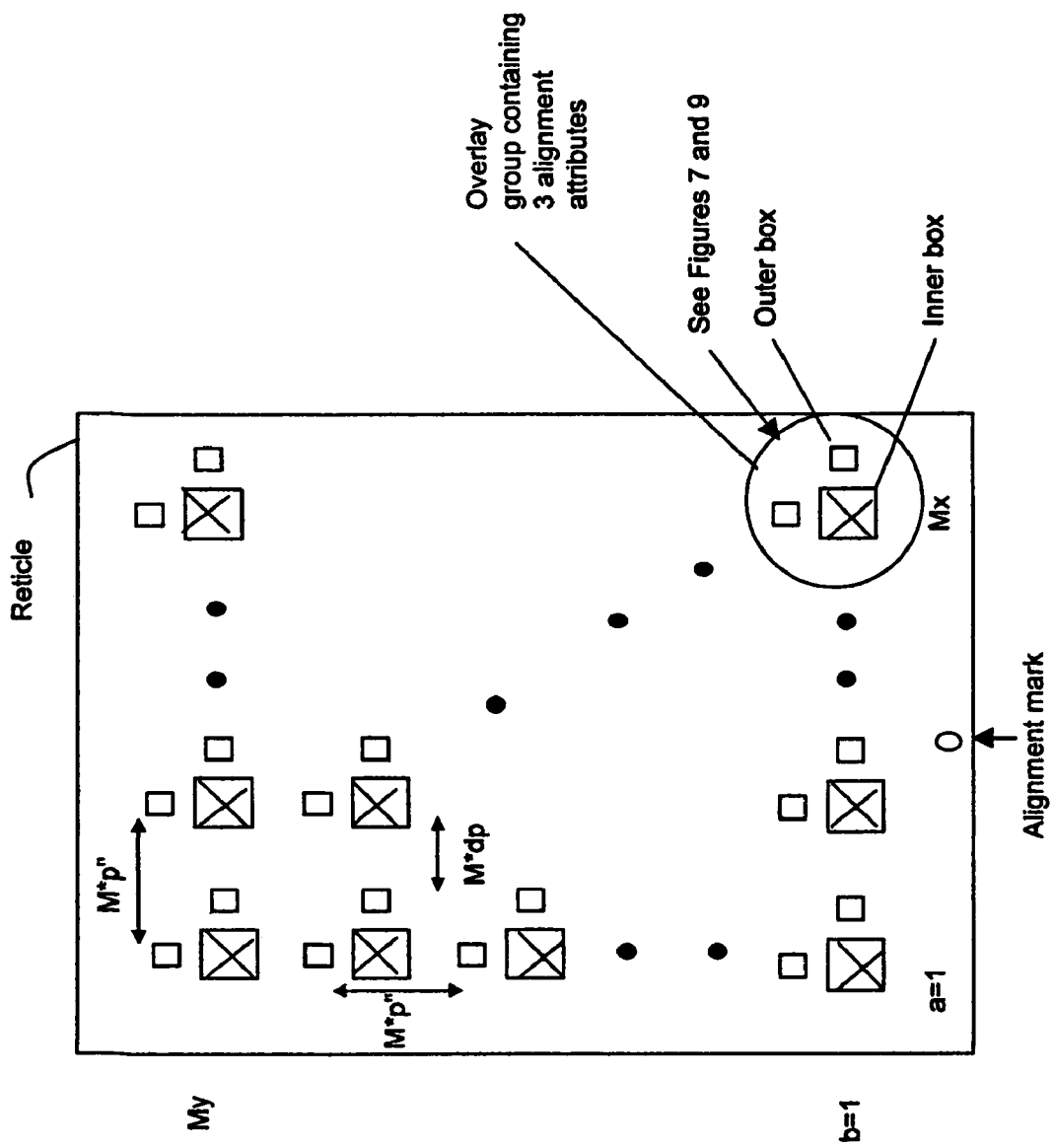

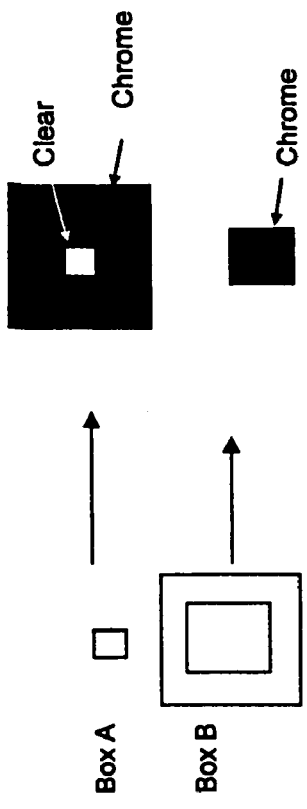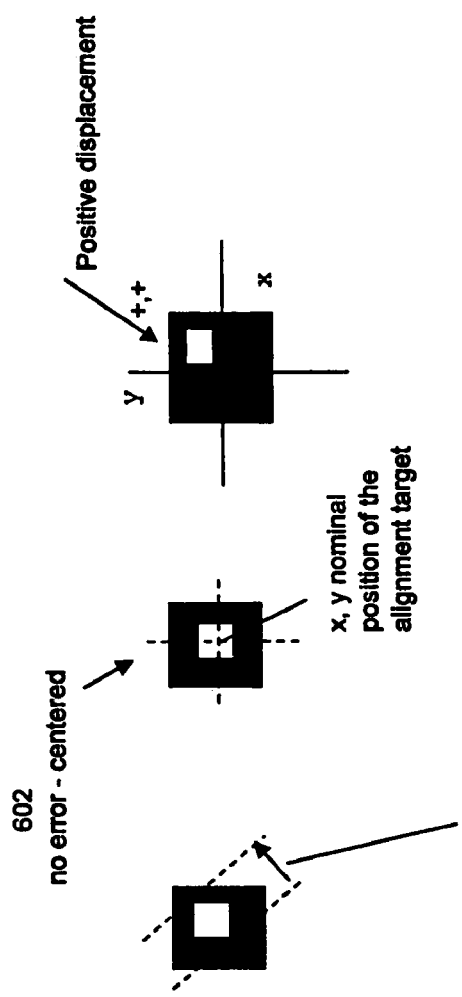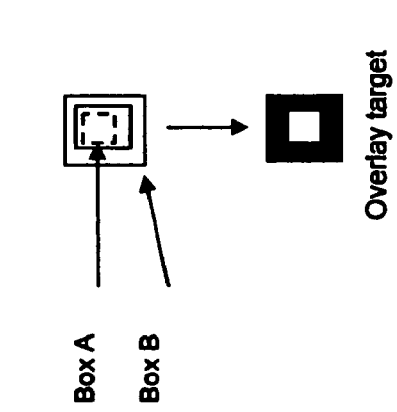

20um x 20um

50um, 10um x 10um, 50um

M*p, M*dp, repeat, M*p = array pitch, repeat um = microns
all data shown in dimensions
60 um, 60um, 85um

Figure 15
PRIOR ART
 ← box-in-box 1502
 ← frame-in-frame 1504
 ← segmented frame-in-frame 1506
 ← multi-segmented frame-in-frame 1508

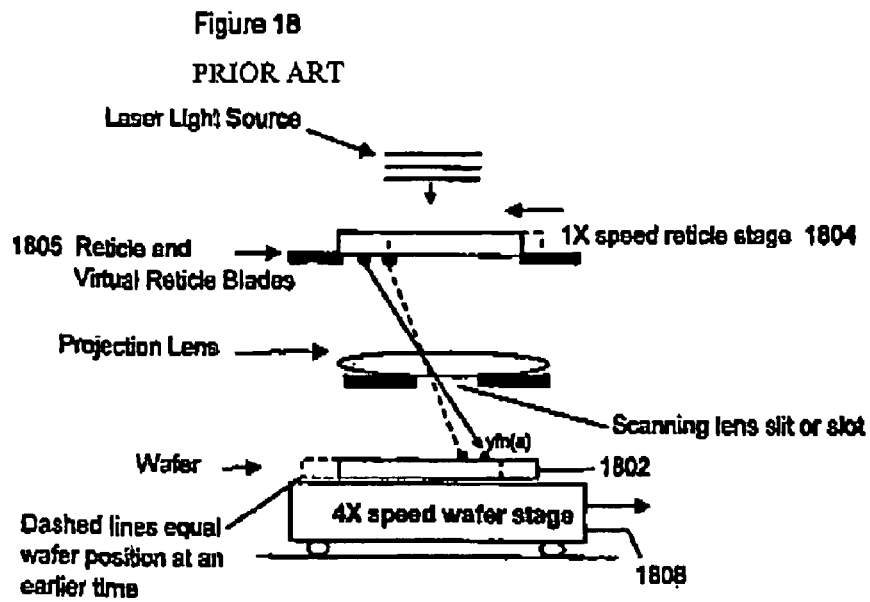
Figure 18
PRIOR ART
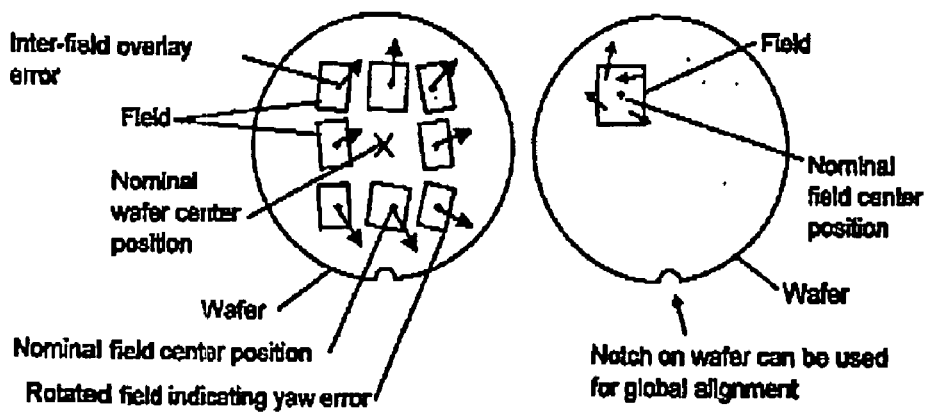
Figure 19
Figure 20

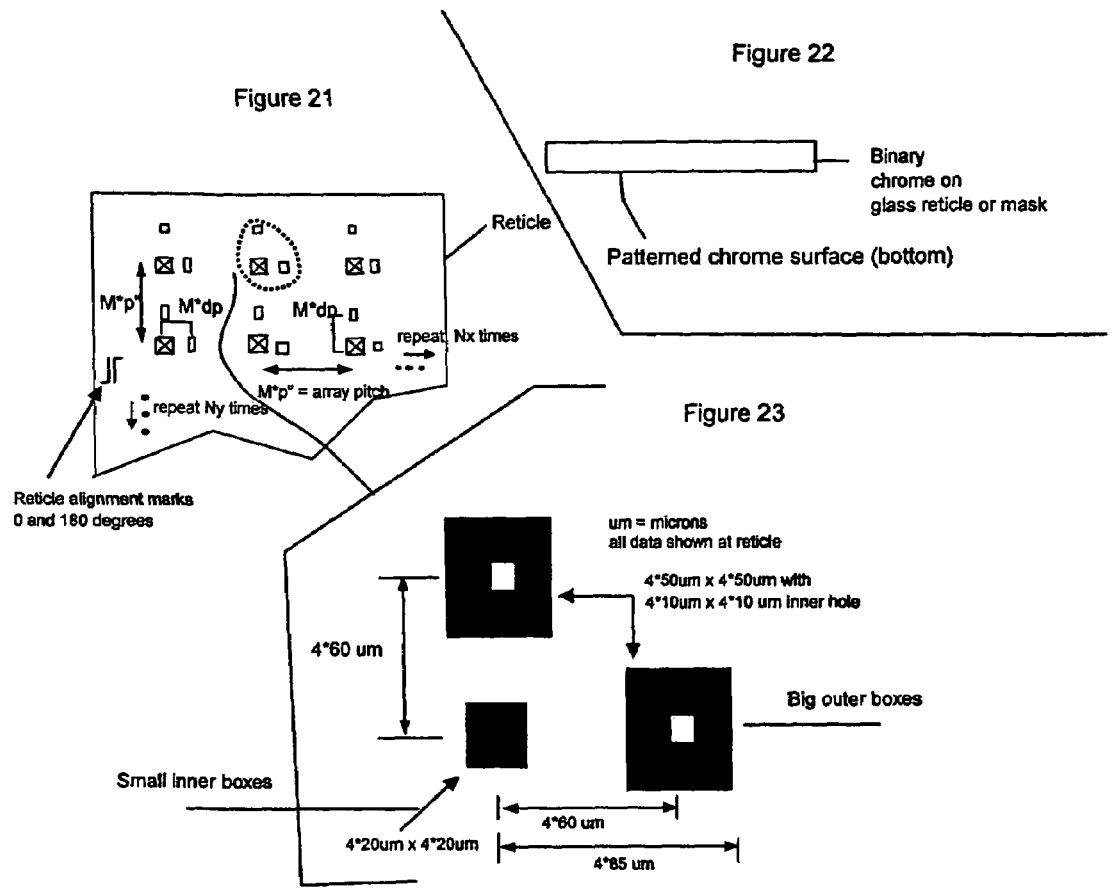
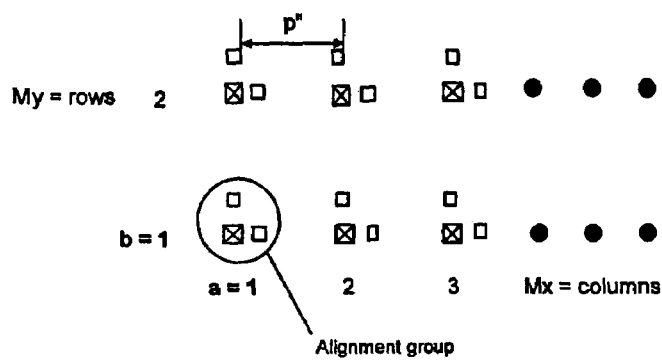

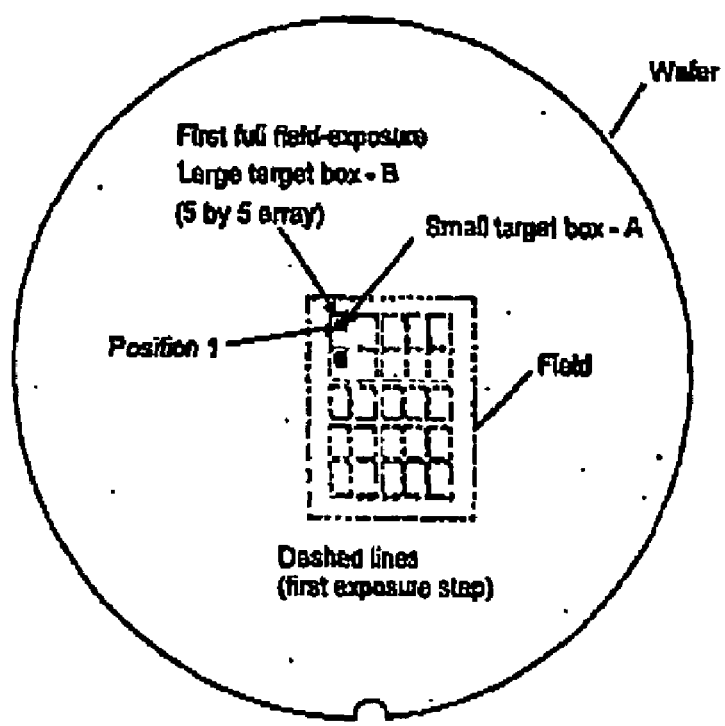

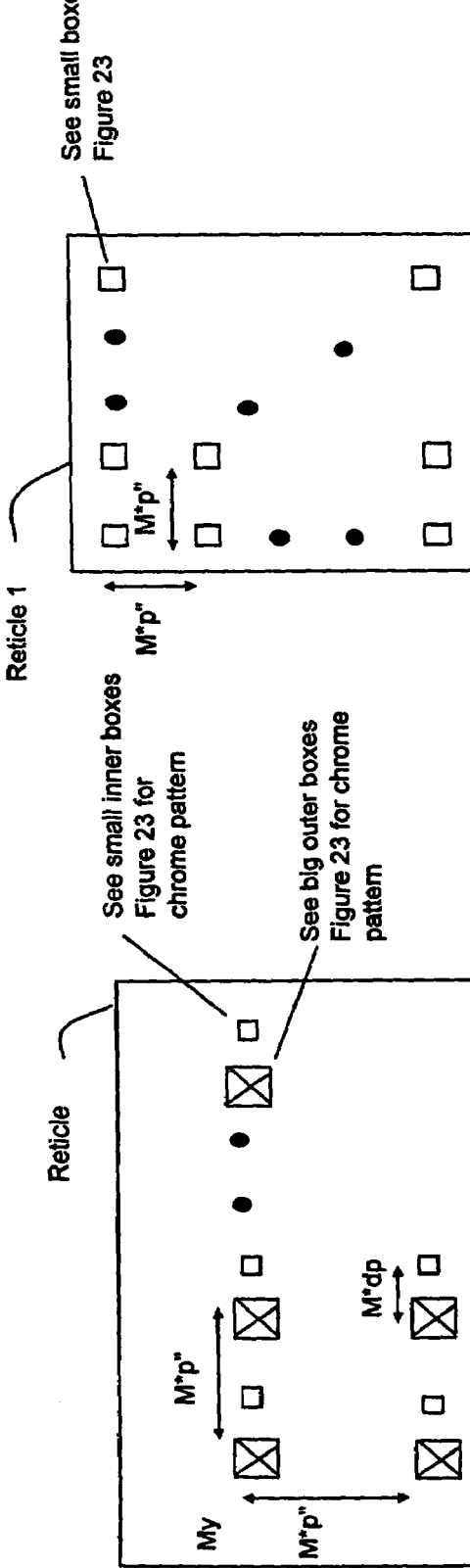
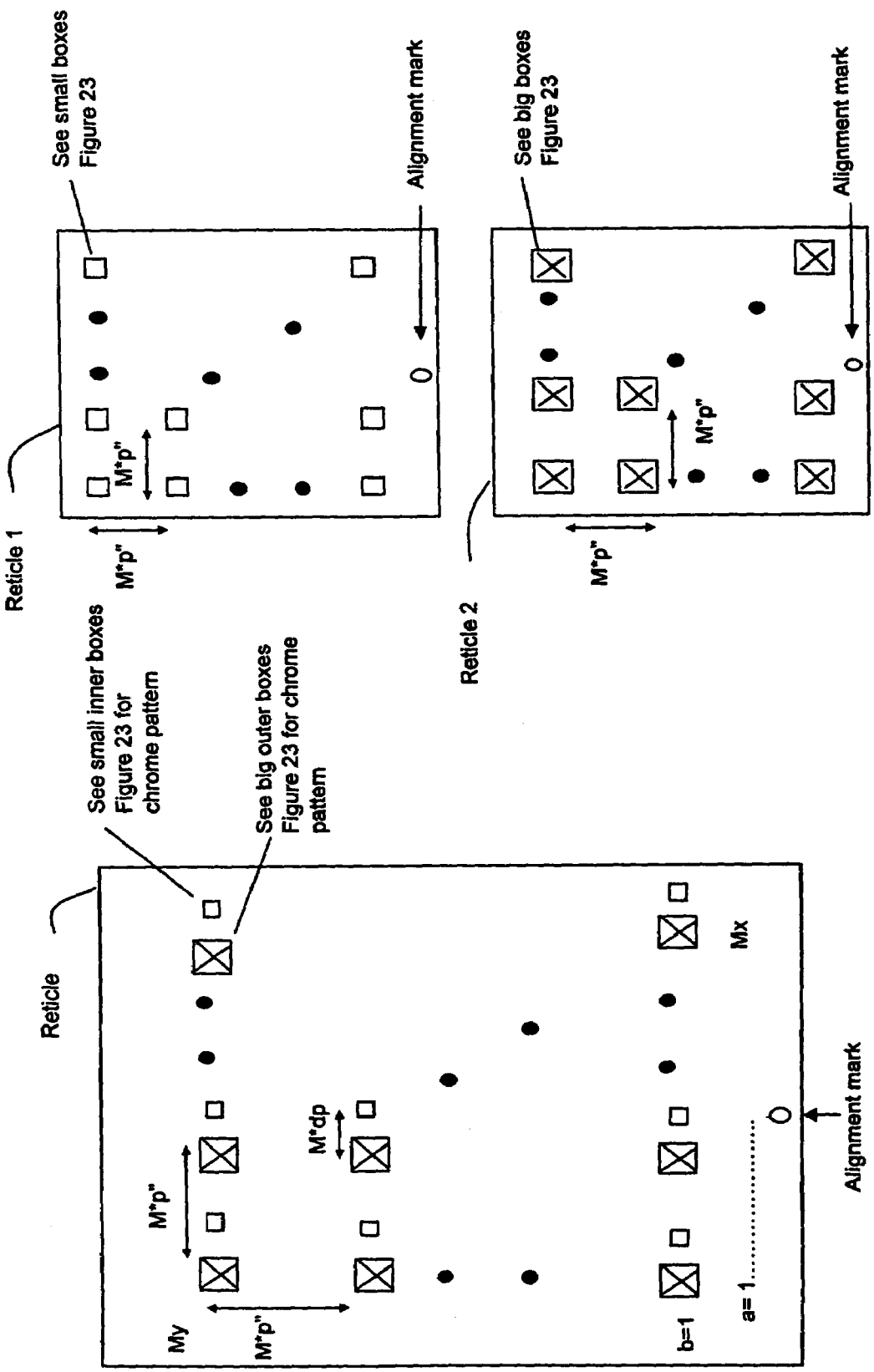

```
machine id: DUVF11-02
    xfn       ΔxL(xfn)    ΔyL(xfn)
-10000.000    -0.139       0.044
 -8000.000     0.223      -0.233
 -6000.000     0.498       0.004
     .           .           .
     .           .           .
     .           .           .
 10000.000     0.099      -0.188
```

Figure 37

| I | IX | IYi | IYo | XR | YRi | YRo | BBX | BBY | DXRi | DXRo | DYRi | DYRo |
|---|----|-----|-----|-----|------|------|-------|-------|-------|-------|-------|-------|
| 1 | 1 | 1 | 2 | -50 | -49 | -25 | 0.017 | 0.023 | -.022 | .001 | .003 | .002 |
| 2 | 1 | 2 | 3 | -25 | -49 | -25 | 0.010 | 0.020 | -.001 | .005 | -.002 | .001 |
| . | . | . | . | . | . | . | . | . | . | . | . | . |
| . | . | . | . | . | . | . | . | . | . | . | . | . |
| . | . | . | . | . | . | . | . | . | . | . | . | . |

Figure 50

METHOD AND APPARATUS FOR SELF-REFERENCED DYNAMIC STEP AND SCAN INTRA-FIELD LENS DISTORTION

REFERENCE TO RELATED APPLICATIONS

This application is a continuation-in-part of U.S. patent application Ser. No. 10/869,270 filed Jun. 15, 2004 entitled "Method for Self-Referenced Dynamic Step and Scan Intra-Field Lens Distortion" which is now U.S. Pat. No. 6,975,382, by Adlai Smith, which is a continuation of U.S. patent application Ser. No. 10/252,020 filed Sep. 20, 2002, now U.S. Pat. No. 6,906,780 issued Jun. 14, 2005, entitled "Method for Self-Referenced Dynamic Step and Scan Intra-Field Lens Distortion" by Adlai Smith, which claims the benefit of priority to U.S. Provisional Patent Application Ser. No. 60/323,571 filed Sep. 20, 2001, entitled "Method for Self-Referenced Dynamic Step and Scan Intra-Field Lens Distortion", by Adlai Smith. Priority of the filing date of these applications is hereby claimed, and the disclosures of the Patent Applications are hereby incorporated by reference.

BACKGROUND OF THE INVENTION

1. Field of the Invention

The present invention relates generally to optical metrology and more particularly to characterizing and monitoring intra-field distortions of projection imaging systems used in semiconductor manufacturing.

2. Description of the Related Art

Today's lithographic processing requires ever tighter layer-to-layer overlay tolerances to meet device performance requirements. Overlay registration is defined as the translational error that exists between features exposed layer to layer in the vertical fabrication process of semiconductor devices on silicon wafers. Other names for overlay registration include, registration error and pattern placement error, and overlay error. Overlay registration on critical layers can directly impact device performance, yield and repeatability. Increasing device densities, decreasing device feature sizes and greater overall device size conspire to make pattern overlay one of the most important performance issues during the semiconductor manufacturing process. The ability to accurately determine correctable and uncorrectable pattern placement error depends on the fundamental techniques and algorithms used to calculate lens distortion, stage error, and reticle error.

A typical microelectronic device or circuit may consist of 20–30 levels or pattern layers. The placement of pattern features on a given level must match the placement of corresponding features on other levels, i.e., overlap, within an accuracy which is some fraction of the minimum feature size or critical dimension (CD). Overlay error is typically, although not exclusively, measured with a metrology tool appropriately called an overlay tool using several techniques. See for example, Semiconductor Pattern Overlay, N. Sullivan, SPIE Critical Reviews Vol. CR52, 160:188. The term overlay metrology tool or overlay tool means any tool capable of determining the relative position of two pattern features or alignment attributes, that are separated within 500 um (microns) of each other. The importance of overlay error and its impact to yield can be found elsewhere. See Measuring Fab Overlay Programs, R. Martin, X. Chen, I. Goldberger, SPIE Conference on Metrology, Inspection, and Process Control for Microlithography XIII, 64:71, March, 1999; New Approach to Correlating Overlay and Yield, M. Preil, J. McCormack, SPIE Conference on Metrology, Inspection, and Process Control for Microlithography XIII, 208:216, March 1999.

Lithographers have created statistical computer algorithms (for example, Klass II and Monolith) that attempt to quantify and divide overlay error into repeatable or systematic and non-repeatable or random effects. See Matching of Multiple Wafer Steppers for 0.35 Micron Lithography Using Advanced Optimization Schemes, M. van den Brink, et al., SPIE Vol. 1926, 188:207, 1993; A Computer Aided Engineering Workstation for Registration Control, E. McFadden, C. Ausschnitt, SPIE Vol. 1087, 255:266, 1989; Semiconductor Pattern Overlay, supra; Machine Models and Registration, T. Zavecz, SPIE Critical Reviews Vol. CR52, 134:159. An overall theoretical review of overlay modeling can be found in Semiconductor Pattern Overlay, supra.

Overlay error is typically divided into the following two major categories. The first category, inter-field or grid overlay error, is concerned with the actual position of the translation and rotation, or yaw, of the image field as recorded in the photoresist on a silicon wafer using an exposure tool, i.e., stepper or scanner. Translation is referenced from the nominal center of the wafer while yaw is referenced with respect to the nominal center at each field. See FIG. 19. The alignment of the device pattern on the silicon wafer depends on the accuracy of the stepper or scanner wafer stage, reticle stage and any interaction between them.

The second category, intra-field overlay error, is the positional offset of an individual point inside a field referenced to the nominal center of an individual exposure field, as illustrated in FIG. 20. The term "nominal center" means the machine programmed stepping position. Intra-field overlay errors are generally related to lens aberrations or distortions, scanning irregularities, and reticle alignment. It is common practice to make certain assumptions concerning the magnitude and interaction of stage error and lens distortion error in modern overlay algorithms that calculate lens distortion. The common rule is: "trust the accuracy of the stage during the creation of the overlay targets by making the simple assumption that only a small amount of stage error is introduced and can be accounted for statistically". See A "Golden Standard" Wafer Design for Optical Stepper Characterization, K. Kenp et al., SPIE Vol. 1464, 260:266, 1991; Matching Performance for Multiple Wafer Steppers Using an Advanced Metrology Procedure, M. Van den Brink, et al., SPIE Vol. 921, 180:197, 1988. When applied to measurements of intra-field distortion this technique is called stage metered measurement of lens distortion.

It is important for this discussion to realize that most overlay measurements are made on silicon product wafers after each photolithographic process, prior to final etch. Product wafers cannot be etched until the resist target patterns are properly aligned to the underlying target patterns. See Super Sparse Overlay Sampling Plans: An Evaluation of Methods and Algorithms for Optimizing Overlay Quality Control and Metrology Tool Throughput, J. Pellegrini, SPIE Vol. 3677, 72:82. Manufacturing facilities rely heavily on exposure tool alignment and calibration procedures to help insure that the stepper or scanner tools are aligning properly; See Stepper Matching for Optimum Line Performance, T. Dooly et al., SPIE Vol. 3051, 426:432, 1997; Mix-and-Match: A Necessary Choice, R. DeJule, Semiconductor International, 66:76, February 2000; Matching Performance for Multiple Wafer Steppers Using an Advanced Metrology Procedure, supra. Inaccurate overlay modeling algorithms can corrupt the exposure tool calibration procedures and degrade the alignment accuracy of the exposure tool system. See Super Sparse Overlay Sampling Plans: An Evaluation of Methods and Algorithms for Optimizing Overlay Quality Control and Metrology Tool Throughput, supra.

Over the past 30 years the microelectronics industry has experienced dramatic rapid decreases in critical dimension by moving constantly improving photolithographic imaging systems. Today, these photolithographic systems are pushed to performance limits. As the critical dimensions of semiconductor devices approach 50 nm the overlay error requirements will soon approach atomic dimensions. See Life Beyond Mix-and-Match: Controlling Sub-0.18 micron Overlay Errors, T. Zavecz, Semiconductor International, July, 2000. To meet the needs of next generation device specifications new overlay methodologies will need to be developed. In particular, overlay methodologies that can accurately separate out systematic and random effects and break them into assignable causes will greatly improve device process yields. See A New Approach to Correlating Overlay and Yield, supra.

In particular, those new overlay methodologies that can be implemented into advanced process control or automated control loops will be most important. See Comparisons of Six Different Intra-field Control Paradigms in an Advanced Mix and Match Environment, J. Pellegrini, SPIE Vol. 3050, 398:406, 1997; Characterizing Overlay Registration of Concentric 5× and 1× Stepper Exposure Fields Using Inter-Field Data, F. Goodwin et al., SPIE Vol. 3050, 407:417, 1997. Finally, another area where quantifying lens distortion error is of vital concern is in the production of photomasks or reticles during the electron beam manufacturing process. See Handbook of Microlithography and Microfabrication, P. Rai-Choudhury, Vol. 1, pg. 417, 1997.

Semiconductor manufacturing facilities generally use some version of the following complex overlay procedure to help determine the magnitude of intra-field distortion independent of other sources of systematic overlay error for both photolithographic steppers and scanners. The technique has been simplified for illustration. See Analysis of Image Field Placement Deviations of a 5× Microlithographic Reduction Lens, D. MacMillen et al., SPIE Vol. 334, 78:89, 1982. FIGS. 3 and 4 show typical sets of overlay targets, including—one large or outer box and one small or inner target box. FIG. 1 shows a typical portion of a distortion test reticle used in the prior art. It should be noted that the chrome target patterns on most reticles are 4 or 5 times larger as compared with the patterns they produce at the image plane, this simply means modern stepper and scan systems (scanners) are reduction systems. Further, for purposes of discussion, it is assumed that the reticle pattern is geometrically perfect, (in practice, the absolute positions of features on the reticle can be measured and the resulting errors subtracted off). First, a wafer covered with photoresist is loaded onto the wafer stage and globally aligned. Next, the full-field image of the reticle, in FIG. 2a is exposed onto the resist-coated wafer in FIG. 25. For purposes of illustration, we assume that the distortion test reticle consists of a 5×5 array of outer boxes evenly spaced a distance M*P, across the reticle surface. See FIG. 2a. It is typically assumed that the center of the optical system is virtually aberration free. See Analysis of Image Field Placement Deviations of a 5× Microlithographic Reduction Lens, supra. With this assumption, the reticle, in FIG. 2a, is now partially covered using the reticle blades, See FIG. 18, in such a way that only a single target at the center of the reticle field, box A, in FIG. 2a, is available for exposure. Next, the wafer stage is moved in such a way as to align the center of the reticle pattern directly over the upper left hand corner of the printed 5×5 outer box array, wafer position 1, FIG. 25. The stepper then exposes the image of the small target box onto the resist-coated wafer. If the wafer stage, optical system, and scanning dynamics were truly perfect then the image of the small target box would fit perfectly inside the image of the larger target box from the previous exposure, as illustrated in FIGS. 5, 6, and 25.

At this point the stepper and wafer stage are programmed to step and expose the small target box in the 5×5 array where each exposure is separated from the previous one by the stepping distance P. With the assumption of a perfect stage, the final coordinates of the small target boxes are assumed to form a perfect grid, where the spacing of the grid is equal to the programmed stepping distance, P. Finally, if the first full-field exposure truly formed a perfect image, then the entire 5×5 array of smaller target boxes would fit perfectly inside the 5×5 array of larger target boxes as illustrated in FIG. 6. Since the first full-field exposure pattern is in fact distorted due to an imperfect imaging system, and scanner system, the actual position of the larger target box will be displaced relative to the smaller target boxes for example, as shown in FIG. 6. The wafer is then sent through the final few steps of the photographic process to create the final resist patterned overlay targets. The intra-field overlay error at each field position can be measured with a standard optical overlay tool. Using the models described below, in Equations 1 and 2, the overlay data is analyzed and the lens distortion error is calculated.

The following inter-field and intra-field modeling equations are commonly used to fit the overlay data using a least square regression technique. See Analysis of Image Field Placement Deviations of a 5× Microlithographic Reduction Lens, supra; Super Sparse Overlay Sampling Plans: An Evaluation of Methods and Algorithms for Optimizing Overlay Quality Control and Metrology Tool Throughput, supra.

$$dxf(xf,yf)=Tx+s*xf-q*yf+t1*xf^2+t2*xf*yf-E*(xf^3+xf*yf^2) \quad (eq.\ 1)$$

$$dyf(xf,yf)=Ty+s*yf+q*xf+t2*yf^2+t1*xf*yf-E*(yf^3+yf*xf^2) \quad (eq.\ 2)$$

where
(xf,yf)=intra-field coordinates
(dxf, dyf)(xf,yf)=intra-field distortion at position (xf, yf)
(Tx, Ty)=(x,y) intra-field translation
s=intra-field overall scale or magnification
q=intra-field rotation
(t1, t2)=intra-field trapezoid error
E=intra-field lens distortion.

A problem with the this technique is two-fold, first, it is standard practice to assume that the wafer stage error is very small, randomly distributed, and can be completely accounted for using a statistical model. See Analysis of Image Field Placement Deviations of a 5× Microlithographic Reduction Lens, supra; A "Golden Standard" Wafer Design for Optical Stepper Characterization, supra; Matching Management of Multiple Wafer Steppers Using a Stable Standard and a Matching Simulator, M. Van den Brink et al., SPIE Vol. 1087, 218:232, 1989; Matching Performance for Multiple Wafer Steppers Using an Advanced Metrology Procedure, supra. In general, positional uncertainties in the wafer stage introduce both systematic and random errors, and since the intra-field is measured only in reference to the lithography tool's wafer stage, machine to machine wafer stage differences show up as inaccurate lens distortion maps. Secondly, the assumption that lens distortion is zero at the center of the lens is incorrect. Furthermore, the model represented by Equations 1 and 2 is entirely unsuited to modeling scanner scale overlay errors—typically the intra-field distortion model accounts only for the scanner skew and scanner scale overlay errors—in general, the synchronization errors between the reticle stage and wafer stage introduce more complex errors described below.

A technique for stage and 'artifact' self-calibration is described in See Self-Calibration in Two-Dimensions: The Experiment, M. Takac, et al., SPIE Vol. 2725, 130:146, 1996; Error Estimation for Lattice Methods of Stage Self-Calibration, M. Raugh, SPIE Vol. 3050, 614:625, 1997. It consists of placing a plate (artifact) with a rectangular array of measurable targets on a stage and measuring the absolute positions of the targets using a tool stage and the tool's image acquisition or alignment system. This measurement process is repeated by reinserting the artifact on the stage but shifted by one target spacing in the X-direction, then repeated again with the artifact inserted on the stage shifted by one target spacing in the Y-direction. Finally, the artifact is inserted at 90-degrees relative to its' initial orientation and the target positions measured. The resulting tool measurements are a set of (x, y) absolute positions in the tool's nominal coordinate system. Then, the absolute positions of both targets on the artifact and a mixture of the repeatable and non-repeatable parts of the stage x, y grid error are then determined to within a global translation (Txg, Tyg), rotation (qg) and overall scale ((sxg+syg)/2) factor. A drawback to this technique is that it requires that the measurements be performed on the same machine that is being assessed by this technique. Furthermore, this technique requires measurements made on a tool in absolute coordinates; the metrology tool measures the absolute position of the printed targets relative to it's own nominal center; so absolute measurements are required over the entire imaging field (typical size greater than about 100 mm$^2$).

Another technique for the determination of intra-field distortion is the method of A. H. Smith et al. ("Method And Apparatus For Self-Referenced Projection Lens Distortion Mapping", U.S. patent application Ser. No. 09/835,201, filed Apr. 13, 2001). It is a self-referencing technique that can be utilized with overlay metrology tools in a production environment. For diagnosing the intra-field scanner distortion in the presence of significant scanner non-repeatability, this technique teaches the use of a special reticle that has reduced optical transmission that is multiply scanned producing sub-Eo exposures on the wafer. This technique can be used to accurately determine the repeatable part of the scanner intra-field distortion but not that part of the intra-field distortion that changes from scan to scan (a simple example of which is the scanner y-magnification).

Another drawback to these techniques to determine the intra-field error is that they use the scanner itself as the metrology tool. Due to the cost of scanners, which can exceed 10 million dollars, it is desirable to have a technique for intra-field error that does not use the scanner itself as the metrology tool for determining intra-field distortion but utilizes relatively inexpensive overlay metrology tools. Furthermore, it is desirable that the technique be easy to perform and thereby allowing it to be used in a production environment by the day-to-day operating personnel. It is further desirable to have a technique that can distinguish between the non-repeatable parts of the scanner intra-field distortion.

Other references that discuss aspects of intra-field distortion include: New 0.54 Aperture I-Line Wafer Stepper with Field by Field Leveling Combined with Global Alignment, M. Van den Brink et al., SPIE Vol. 1463, 709:724, 1991; Impact of Lens Aberrations on Optical Lithography, T. Brunner; Lens Matching and Distortion Testing in a Multi-Stepper, Sub-Micron Environment; A. Yost et al., SPIE Vol. 1087, 233:244, 1989; The Attenuated Phase Shift Mask, B. Lin; Projection Optical System for Use in Precise Copy, T. Sato et al., U.S. Pat. No. 4,861,148, Aug. 29, 1989; Method of Measuring Bias and Edge Overlay Error for Sub 0.5 Micron Ground Rules, C. Ausschnitt et al., U.S. Pat. No. 5,757,507, May 26, 1998.

Therefore there is a need for an effective, and efficient, way to determine the scanner intra-field distortion or translation errors of a projection system.

SUMMARY

A method and apparatus in accordance with the invention determines the reticle stage component of synchronization error in a projection imaging tool. The techniques include exposing a first portion of a reticle pattern onto a substrate with a recording media thereby producing a first exposure. The first portion of the reticle pattern includes at least two arrays of alignment attribute that have features complementary to each other. The reticle stage is then shifted and a second portion of the reticle pattern is exposed. The first and second exposures overlap and interlock to create completed alignment attributes. Measurements of positional offsets of the completed alignment attributes are used to determine the reticle stage portion of synchronization error. For example, the reticle stage portion of synchronization error can include grid and yaw error.

A desired number of completed alignment attributes can be produced by repeatedly shifting the reticle stage and exposing additional portions of the reticle. Exposing a portion of a reticle can be accomplished by using blades that cover a portion of a reticle. Also, the substrate that is exposed can be a semiconductor surface, a silicon wafer, a flat panel display, a reticle, a photolithographic mask, or an electronic recording media. The recording media on the substrate can be a negative resist material, a positive resist material, an electronic CCD, a liquid crystal material, or an optically sensitive material. In addition, the reticle can include a reduced transmission material or an attenuated phase shift mask. Also, the exposure may be made using a plurality of E0 (E zero) exposures.

The projection imaging tool that has its reticle stage grid and yaw determined can be used in a photolithographic stepper system, a photolithographic scanner system, an electronic beam imaging system, an extreme ultra-violet photolithographic tool, or an x-ray imaging system.

Another technique is that a projection imaging tool reticle stage grid and yaw can be determined by stepping a wafer stage so as to position a substrate with a recording media in a desired location and then exposing a first portion of a reticle pattern onto a substrate with a recording media thereby producing a first exposure. A first portion of the reticle pattern includes at least two arrays of alignment attribute that have features complementary to each other. The reticle stage is then shifted and a second portion of the reticle pattern is exposed. The first and second exposures overlap and interlock to create completed alignment attributes. Then, repeated stepping, exposing, shifting, a desired number of times produces completed alignment attributes. Measurements of positional offsets of the completed alignment attributes are used to determine the reticle stage grid and yaw.

The techniques can be used on projection imaging tools used in the manufacture of integrated circuits. In addition, the determined reticle grid and yaw can be used in controlling the reticle stage of a projection imaging tool.

Other features and advantages of the present invention should be apparent from the following description of the preferred embodiment, which illustrates, by way of example, principles of the invention.

BRIEF DESCRIPTION OF THE DRAWINGS

FIG. 1a is a schematic of a typical scanner exposure field and the coordinate system used for calculation purposes.

FIG. 1b shows a schematic of some typical alignment attributes—described in FIG. 12.

FIG. 2b shows a reticle schematic for the preferred embodiment for use with photolithographic scanners.

FIG. 3 shows a schematic version of the overlay features described in FIG. 2a.

FIG. 4 shows the actual chrome reticle patterns for the schematics in FIG. 3 or the reticle features of FIG. 2a.

FIG. 5 shows a schematic of overlapping alignment attributes.

FIG. 6 shows the alignment attribute coordinate system and the definition of overlay error using vector notation.

FIG. 15 shows an illustration of some typical overlay targets or alignment attributes.

FIG. 18 shows an illustration of a typical photolithographic step and scan or scanner system.

FIG. 19 gives a visual definition of inter-field overlay error in terms of vector plots.

FIG. 20 gives a visual definition of intra-field overlay error in terms of vector plots.

FIG. 21 shows a portion of the reticle for the preferred embodiment.

FIG. 22 shows a cross-sectional view of the reticle in FIG. 21 and FIG. 2b with anti-reflective coatings.

FIG. 23 shows a detail of the overlay group on the overlay reticle shown in FIG. 21 and FIG. 2b.

FIG. 24 shows the intra-field indices for the preferred embodiment as printed on the wafer.

FIG. 25 shows a typical exposure pattern for a prior art lens distortion test.

FIG. 35 and FIG. 36 show an alternative set of reticles for the preferred methodology.

FIG. 37 shows the final results for this invention in the form of a taped read-out.

FIG. 50 shows the input data structure to a computer code used to reconstruct reticle stage distortion.

DETAILED DESCRIPTION

Overview

Overlay error is often referred to as registration error or pattern placement error, or simply error, of a reticle pattern projected onto a substrate or wafer. Overlay error is typically classified, or divided, into the following two categories: grid or inter-field error and intra-field error. Intra-field error is the overlay error in placement within a projection field (or simply referred to as a field), of a lithographic projection system. Inter-field error is the overlay error from field to field on the wafer. Examples of intra-field error are illustrated in FIG. 20, and examples of inter-field errors are illustrated in FIG. 19. For photolithographic scanners the physical sources of these errors are generally distinct, with intra-field errors due to static projection lens aberrations and/or scanning dynamics while inter-field errors are due to the wafer alignment system, wafer stage and the reticle stage. As described below, intra-field error produced by the lens or imaging objective optics associated with photolithographic scanners is determined.

In order to measure overlay error using conventional optical metrology tools, special alignment attributes or overlay target patterns (See FIGS. 7–12 and 14a) can be printed or imaged onto a properly designed recording media using a photolithographic imaging system. See also FIG. 18. FIG. 15 shows examples of overlay target patterns, such as box-in-box, frame-in-frame, segmented frame-in-frame, and multi-segmented frame-in-frame. FIG. 18 is a block diagram of a typical photolithographic imaging system that can be used to image the overlay target pattern onto a recording media. The recording media can include positive or negative photoresist, optically activated liquid crystals, CCD or diode imaging arrays, and photographic film. In some cases the overlay error can be measured using special in-situ exposure tool metrology. See Matching Management of Multiple Wafer Steppers Using a Stable Standard and a Matching Simulator, supra.

The deviation of the positional overlap of the alignment attributes from their nominal or machine-programmed position is the metric used to quantify overlay error. FIG. 6 shows examples of the position of alignment attributes. As shown in FIG. 6, examples of the alignment of the attribute included centered, having no error, a positive displacement, and a transverse overlay error. As noted, there are many different kinds of alignment attributes, including, box-in-box, frame-in-frame, gratings, verniers, and electrical test structures. See Automated Electrical Measurements of Registration Errors in Step and Repeat Optical Lithography Systems, T. Hasan et al., IEEE Transactions on Electron Devices, Vol. ED-27, No. 12, 2304:2312, December 1980; Capacitor Circuit Structure for Determining Overlay Error, K. Tzeng et al., U.S. Pat. No. 6,143,621, Nov. 7, 2000; Overlay Alignment Measurement of Wafers, N. Bareket, U.S. Pat. No. 6,079,256, Jun. 27, 2000.

Figure 34:
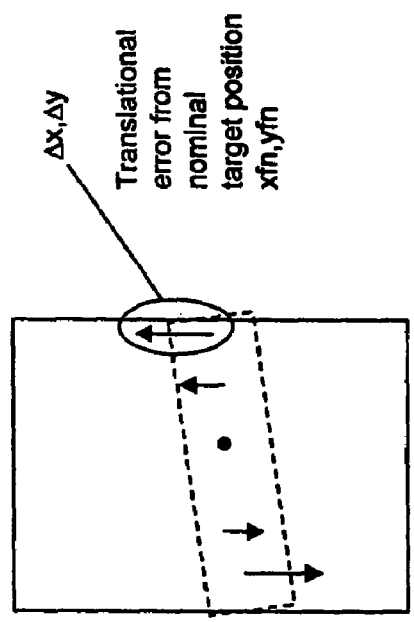
FIG. 34 shows a vector plot of scanning stage yaw in the absence of lens distortion.
Figure 33:
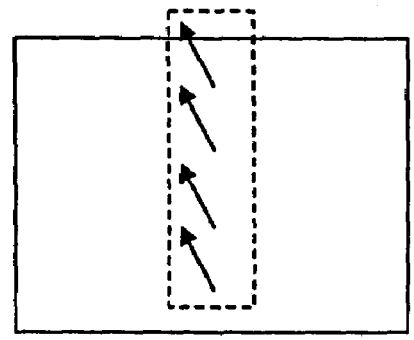
FIG. 33 shows a vector plot of scanning transverse overlay error in the absence of lens distortion.
Figure 32:
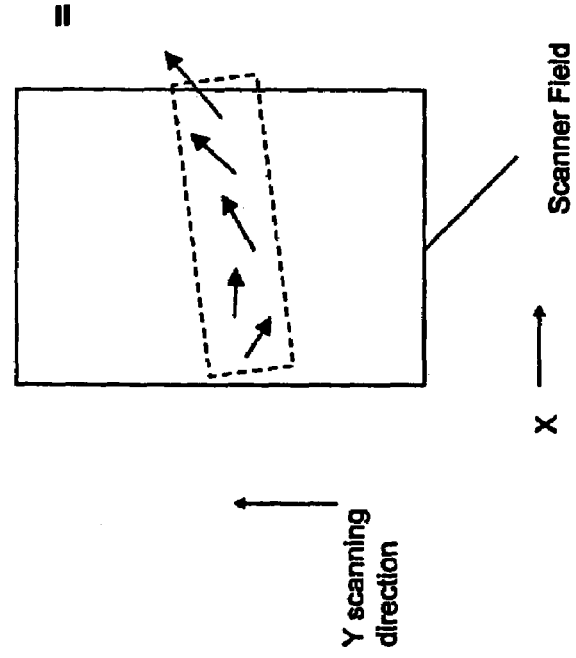
FIG. 32 shows a vector plot of scanning overlay errors in the absence of lens aberration/distortion.

Examples of photolithographic scanning tools that the techniques described below cab be used with include, deep-UV, e-beam systems, EUV and x-ray imaging systems. See Mix-and-Match: A Necessary Choice, supra; Reduction Imaging at 14 nm Using Multiplayer-Coated Optics: Printing of Features Smaller than 0.1 Micron, J. Bjorkholm et al., Journal Vacuum Science and Technology, B 8(6), 1509: 1513, November/December 1990; Development of XUV Projection Lithography at 60–80 nm, B. Newnam et al., SPIE Vol. 1671, 419:436, 1992; Optical Lithography— Thirty years and Three Orders of Magnitude, J. Bruning, SPIE Vol. 3051, 14:27, 1997. Vector displacement plots can provide a visual description of the direction, magnitude, and location of overlay error that are mathematically separated into components using variety of regression routines. FIGS. 32–34 are schematics showing an example of a vector displacement plot. Additional examples of mathematically separating overlay error into components can be found in the literature. See Analysis of Overlay Distortion Patterns, J. Armitage, et al., SPIE Vol. 921, 207:221, 1988.

As discussed above, other techniques used to measure the intra-field distortion use the projection lithography tool that is being assessed to make the measurements. An aspect of a technique in accordance with the invention is that the measurements required for determining the intra-field lens distortion can, and preferably are, made on an overlay metrology tool quite distinct from the projection lithography tool that we are assessing. In addition, some other techniques require measurements made on a tool in absolute coordinates. In these techniques the metrology tool measures the absolute position of the printed targets relative to it's own nominal center; so absolute measurements are required over the entire imaging field (typical size greater than about 100 mm$^2$). An aspect of a technique in accordance with the invention uses relative coordinates or displacements of features, such as box in box structures or some other alignment attribute, that are measured with respect to each other, and the distances between these alignment attributes is typically less than about 0.5 mm. For example, in the case of box in box structures these distances are typically less than about 0.02 mm. Eliminating the need to maintain absolute position over a large area is very beneficial. For example, absolute metrology tools such as the Leica LMS 2000, Leica IPRO (See Leica LMS IPRO brochure, Leica), or Nikon 5I (See Measuring system XY-5i, K. Kodama et al., SPIE Vol. 2439, 144:155, 1995) typically cost in excess of 2 million dollars and are uncommon in semiconductor manufacturing facilities ("fabs") while overlay metrology tools such as the KLA 5200, or Bio-rad Q7 typically cost 0.5 million dollars and are widely deployed in fabs. Another drawback to using an absolute position technique is that it requires that the intra-field distortion to be repeatable from exposure to exposure, this is precluded by the scanner dynamics.

Figure 31:
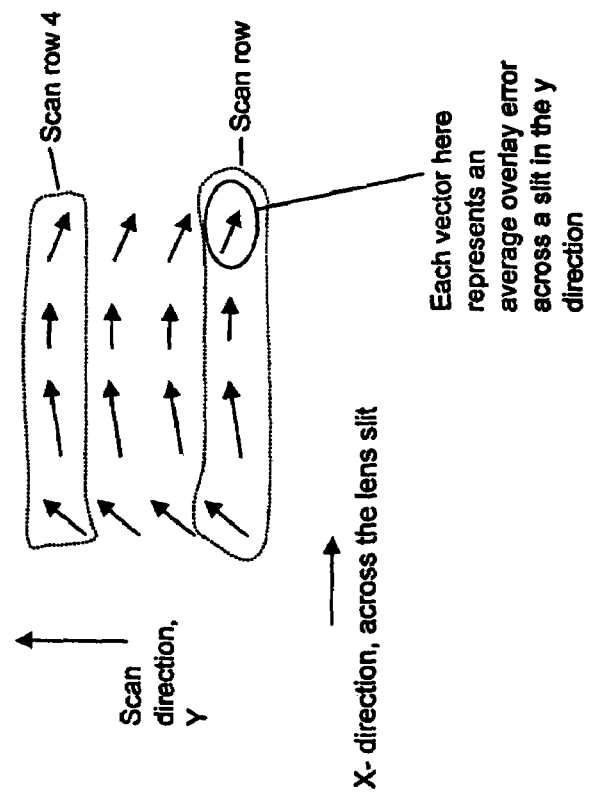
FIG. 31 shows a vector plot of lens distortion or overlay error in the absence of scanning synchronization error.

The structure of scanner intra-field distortion or translational error can be decomposed into a lens component, dependent only on the projection imaging objective or projection system objective or projection system aberrations, See FIG. 31, and a scanning component, dependent only on the relative dynamics of the wafer and reticle scanning motion See FIGS. 32–34. The lens component is repeatable but the scanning component contains both repeatable and non-repeatable parts. In addition, the lens and scanning components have certain functional forms that simplify the extraction of intra-field error. A typical photolithographic step and scan or scanner system produces an image, typically reduced 4× or 5×, of the reticle pattern in the surface of a photoresist by continuously passing exposure radiation through a small portion of the projection optics as the reticle and wafer stage travel in opposite directions. FIG. 18 is a block diagram of a typical photolithographic step and scan or scanner system. As shown in FIG. 18, a scanning reticle stage 1804 and scanning wafer stage 1806 move in opposite directions in a coordinated manner at two different speeds.

FIGS. 1a and 1b show an instantaneous (top down) view of a partially exposed scanner field (and coordinate system) as it might appear on a photoresist coated silicon wafer during a scan. Lack of coordination between the wafer stage and reticle stage in the absence of lens distortion will manifest itself as translational offset error $-\Delta T \blacklozenge (x,y,ys)$ which is defined as the instantaneous translational offset error on the wafer at intra-field position x,y—located inside the image of the lens slit—when the scanner is at position (ys). See FIG. 1a. The final distortion error or overlay error ($\Delta F \blacklozenge (x,y)$) at any point actually imaged in the photoresist is then an average of the instantaneous errors ($\Delta T \blacklozenge (x,y,ys)$), weighted by the intensity function of the scanning slit as expressed in Equation 4, where the distortion effects of the projection lens have been neglected. If the scanner operated perfectly, without synchronization or vibration errors, then the final distortion or translational error, $\Delta sL(x)$ at each field point in the photoresist would simply be the average of the static projection lens distortion $\Delta d(x)$, weighted by the intensity function of a static scanner slit expressed in Equation 5.

Thus, there are two independent sources of transverse scanning error or scanning distortion; projection lens distortion error—that varies in magnitude and direction across the scanner field (in the x direction, or perpendicular to the scanning direction) and synchronization errors that represent an average of the instantaneous (repeatable and non-repeatable) positional offsets of the wafer and reticle stage. These errors are expressed in Equations 3–13 in detail.

Because the reticle and wafer move in a coordinated manner as rigid bodies relative to one another, lack of coordination will show up as instantaneous offset errors, $(\Delta Tx, \Delta Ty) \blacklozenge (x,y,ys)$. Here $(\Delta Tx, \Delta Ty) \blacklozenge (x,y,ys)$ is the instantaneous translational offset error of the projected image at the wafer relative to a perfectly placed wafer is a function not only of the intra-field coordinate (x,y) but also of the instantaneous position, ys, of the wafer relative to the center of the scanning slit. FIG. 1a shows the relation of the full scanner field and field center relative to the slot center, this relative position is ys. For the transverse errors of the stage and reticle the instantaneous offset vector $(\Delta Tx, \Delta Ty) \blacklozenge (x,y,ys)$ will depend only on the instantaneous translational offset error $(\Delta X(ys), \Delta Y(ys))$ and the instantaneous yaw or rotational error $\theta s(ys)$ as:

$$(\Delta Tx, \Delta Ty) \blacklozenge (x,y,ys) = (\Delta X(ys) + \theta s(ys)*(y-ys), \Delta Y(ys) - \theta s(ys)*x) \qquad \text{eq. 3}$$

Another contributor to the instantaneous offset vector arises from the static distortion contribution of the projection lens. Thus if $(\Delta Xsl, \Delta Ysl) \blacklozenge (x,y)$ is the static lens distortion, then it's contribution to the instantaneous offset vector $(\Delta Tx, \Delta Ty)$ will be:

$$(\Delta Tx, \Delta Ty) \blacklozenge (x,y,ys) = (\Delta Xsl, \Delta Ysl) \blacklozenge (x,y-ys) \qquad \text{eq. 3a}$$

Lens distortion is the intra-field distortion of the scanner as determined when the wafer and reticle stages are not moved with respect to one another to produce the scanned image field. Thus, the static lens distortion does not include any contribution from synchronization or dynamic yaw errors due to the relative motion of the reticle and wafer stages. Referring to FIG. 1a, $(\Delta Xsl, \Delta Ysl) \blacklozenge (x,y)$ is defined only over the slot width (SW) 101 and slot height (SH) 102. Therefore x, y vary over the ranges $$x=(-SW/2:SW/2) \; y=(-SH/2:SH/2) \qquad \text{eq. 3b}$$

There are various techniques for determining $(\Delta Xsl, \Delta Ysl)$, a very accurate technique is described in "Method And Apparatus For Self-Referenced Projection Lens Distortion Mapping", A. H. Smith et al., U.S. patent application Ser. No. 09/835,201, filed Apr. 13, 2001. However, this and other techniques for measuring static lens distortion are not required for the techniques described below.

Combining equations 3 and 3a give the total contribution to the instantaneous offset error as:

$$(\Delta Tx, \Delta Ty) \blacklozenge (x,y,ys) = (\Delta Xsl, \Delta Ysl) \blacklozenge (x,y-ys) + (\Delta X(ys) + \theta s(ys)*(y-ys), \Delta Y(ys) - \theta s(ys)*x) \qquad \text{eq. 3c}$$

Here x,y vary over the entire span of intra-field coordinates;

$$x=(-SW/2:SW/2) \; y=(-L/2:L/2) \qquad \text{eq. 3d}$$

while ys varies over the range:

$$ys=(y-SH/2:y+SH/2) \qquad \text{eq. 3e}$$

since the projected image suffers a shift only when the slot (or more precisely any part of the illuminated slot) is over field position (x,y).

The effect of the projected image is then just a weighted average over the slot of the instantaneous offsets $(\Delta Tx, \Delta Ty)$:

$$(\Delta XF, \Delta YF) \blacklozenge (x,y) = \text{INT}\{dys*w(y-ys)*(\Delta Tx, \Delta Ty) \blacklozenge (x,y,ys)\}/\text{INT}\{dys*w(y-ys)\} \qquad \text{eq. 3f}$$

where;

x,y=intra-field coordinates, $x=(-SW/2:SW/2)$, $y=(-L/2:L/2)$
ys=the position of the center of the scanning slit at a given instant in time referenced from the nominal die center
SW=slot width
L=scanner field length
dys=differential amount of the scanner field
INT { }=integral over the scanner field, integration range extends from ys=(-(L+SH)/2:(L+SH)/2))
w(y)=weighting function. In 248 nm resists, typically proportional to the slot intensity profile scanning slit. 0 for points outside the slit opening.
$(\Delta XF, \Delta YF) \blacklozenge (x,y)$=intra-field distortion. Includes effects of scanning synchronization error and lens aberrations.

The two distinct parts of $(\Delta Tx, \Delta Ty)$ (scanner dynamics (Equation 3) and lens distortion (Equation 3a)) are additive and therefore the intra-field distortion, $(\Delta XF, \Delta YF)$, can also be divided up into similar parts as:

$$(\Delta XF, \Delta YF) \blacklozenge (x,y) = (\Delta xL, \Delta yL) \blacklozenge (x) + (\Delta XS(y), \Delta YS(y) - x*d\Delta YS(y)/dx) \qquad \text{eq. 3g}$$

where the lens aberration contribution, $(\Delta xL, \Delta yL) \blacklozenge (x)$, is given by:

$$(\Delta xL, \Delta yL) \blacklozenge (x) = \text{INT}\{dys*w(y-ys)*(\Delta Xsl, \Delta Ysl) \blacklozenge (x,y-ys)\}/\text{INT}\{dys*w(y-ys)\} \qquad \text{eq. 3h}$$

and the scanning dynamics contribution, $(\Delta XS(y), \Delta YS(y) - x*d\Delta YS(y)/dx)$, is given by:

$$(\Delta XS(y), \Delta YS(y) - x*d\Delta YS(y)/dx) = \text{INT}\{dys*w(y-ys)*(\Delta X(ys) + \theta s(ys)*(y-ys), \Delta Y(ys) - \theta s(ys)*x)\}/\text{INT}\{dys*w(y-ys)\} \qquad \text{eq. 3i}$$

Identifying separate components in Equations 3h and 3i gives individual expressions for the various components of overlay error. Thus, the dynamic slip in the x and y directions due to synchronization error is given by:

$$\Delta XS(y) = \text{dynamic slip in the } x \text{ direction} = \text{INT}\{dys*w(ys)*\Delta X(y-ys)\}/\text{INT}\{dys*w(ys)\} \qquad \text{eq. 3j}$$

$$\Delta YS(y) = \text{dynamic slip in the } y \text{ direction} = \text{INT}\{dys*w(ys)*\Delta Y(y-ys)\}/\text{INT}\{dys*w(ys)\} \qquad \text{eq. 3k}$$

the dynamic yaw or rotational error due to synchronization error is given by;

$$d\Delta YS(y)/dx = \text{dynamic yaw} = \text{INT}\{dys*w(ys)*\theta s(ys))\}/\text{INT}\{dys*w(ys)\} \qquad \text{eq. 3l}$$

The influence of the dynamic lens distortions on the intra-field error, $(\Delta xL, \Delta yL)$, is given by;

$$\Delta xL(y) = \text{dynamic lens distortion in the } x \text{ direction} = \text{INT}\{dys*w(ys)*\Delta Xsl(y-ys)\}/\text{INT}\{dys*w(ys)\} \qquad \text{eq. 3m}$$

$$\Delta yL(y) = \text{dynamic lens distortion in the } y \text{ direction} = \text{INT}\{dys*w(ys)*\Delta Ysl(y-ys)\}/\text{INT}\{dys*w(ys)\} \qquad \text{eq. 3n}$$

The interpretation of the structure of the intra-field distortion, $(\Delta XF, \Delta YF)$, can be explained with reference to Equation 3g. In Equation 3g the intra-field distortion is divided into a contribution by the dynamic lens distortion, ($\Delta$xL, $\Delta$yL), that depends only on the cross scan coordinate, x, and is independent of the position along the scanning direction, y. From Equations 3m and 3n, the dynamic lens distortion is a weighted average of the static lens distortion where the weighting factor, w(y), depends on the intensity distribution in the scan direction, y, possibly the photoresist process, and the scanning direction. Because the dynamic lens distortion contains none of the effects of scanning synchronization errors and only effects that are highly repeatable, the dynamic lens distortion will not vary from scan to scan. Thus, the contribution of dynamic lens distortion to the intra-field distortion can be some arbitrary set of vector displacements along a single scan row but will be the same for all rows in the scan as shown in FIG. 31.

The other contributor to intra-field distortion in Equation 3g is the dynamic slip and yaw errors, $\Delta$XS(y), $\Delta$YS(y), d$\Delta$YS(y)/dx, which depend only on the position along the scanning direction, y, and are independent of the cross scan coordinate, x. From Equations 3j, 3k, 3l the dynamic slip and yaw are convolutions of the weighting factor w(y) with the instantaneous translational and yaw offsets. Because dynamic slip and yaw contain nothing but the effects of scanner synchronization error, they will contain both repeatable parts that do not vary from scan to scan and non-repeatable parts that vary from scan to scan. Referring to FIGS. 32, 33 and 34, each row of the scan will have different translation and rotation errors that are generally different and strongly correlated only over distances ~SH, the slot height.

Thus, in the presence of both lens distortion and scanner synchronization error the total overlay distortion error, [$\delta$X(x,y), $\delta$Y(x,y)] can be expressed in the following form;

$$\delta X(x,y) = \Delta XS(y) + \Delta xL(x), \quad \text{eq. 12}$$

$$\delta Y(x,y) = \Delta YS(y) + \Delta yL(x) - x^*d\Delta YS(y)/dx \quad \text{eq. 13}$$

For example, in acid catalyzed photoresists such as those used for KrF or 248 nm lithography, the weighting function will typically be directly proportional to the intensity of light, I(y), across the slot since the latent acid image does not saturate until at very high exposure doses. However, in typical I-line photoresists the latent image saturates at normal exposure doses. This means that at a given location on the photoresist, the exposing light that first impinges consumes a larger portion of the photoactive material than an equal amount of exposing light impinging at a later time. Thus the w(y) will not be proportional to I(y) any longer. Because of this saturation effect, the weighting function will depend not only on the photoresist exposure dose used but also on the scanning direction (positive y or negative y).

Figure 2A:
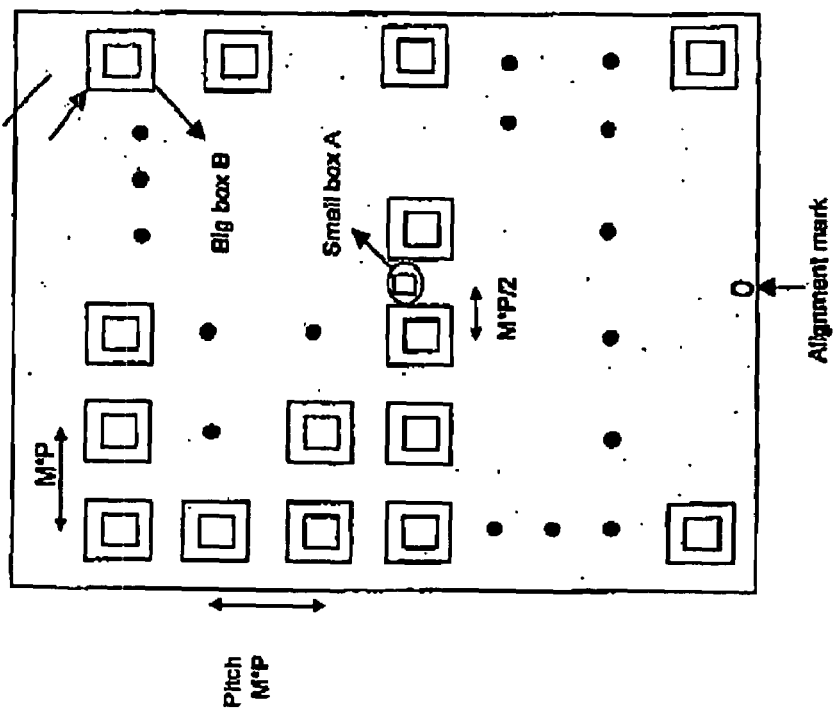
FIG. 2a shows a schematic of a typical reticle used to calculate stage metered scan and lens distortion.
Figure 7:
FIG. 7 shows a schematic for the outer box in FIG. 2b.
Figure 8:
FIG. 8 shows the reticle pattern for the schematic in FIG. 7 as projected onto a photoresist coated wafer.
Figure 9:
FIG. 9 shows a schematic for the inner box in FIG. 2b.
Figure 10:
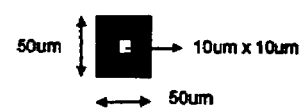
FIG. 10 shows the reticle pattern for the schematic in FIG. 9 as projected onto a photoresist coated wafer.
Figure 11:
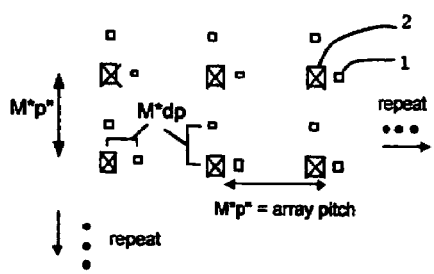
FIG. 11 shows a schematic of a portion of the 4XOL reticle mentioned in the preferred embodiment.
Figure 12:
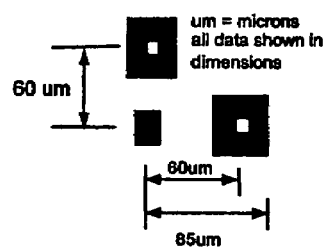
FIG. 12 shows an illustration of the 4XOL reticle alignment attributes as projected onto a photoresist coated wafer.
Figure 16:
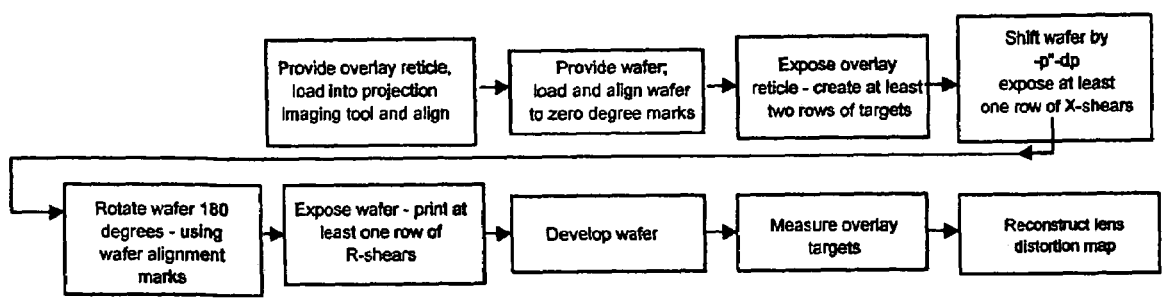
FIG. 16 illustrates a method of extracting intra-field lens distortion for scanners in terms of a flow diagram.
Figure 17:
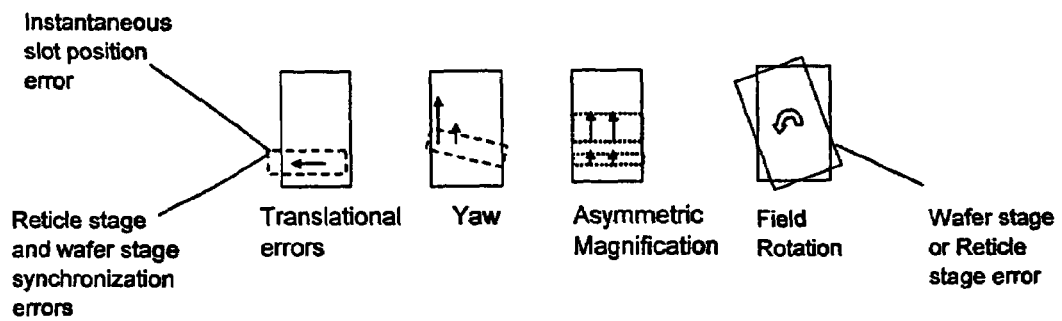
FIG. 17 shows typical scanner intra-field and inter-field overlay error components and common causes.
Figure 27:
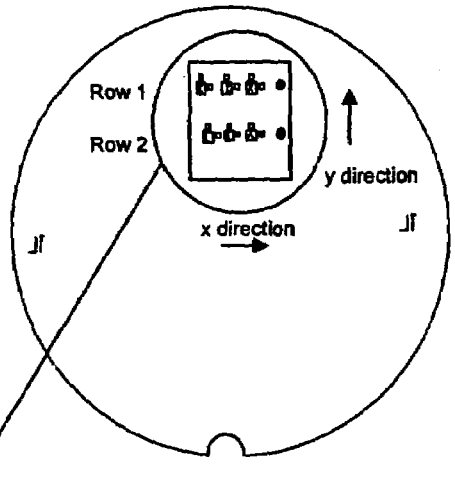
FIG. 27 shows the first exposure pattern for the preferred embodiment using the overlay reticle (FIG. 21).
Figure 30:
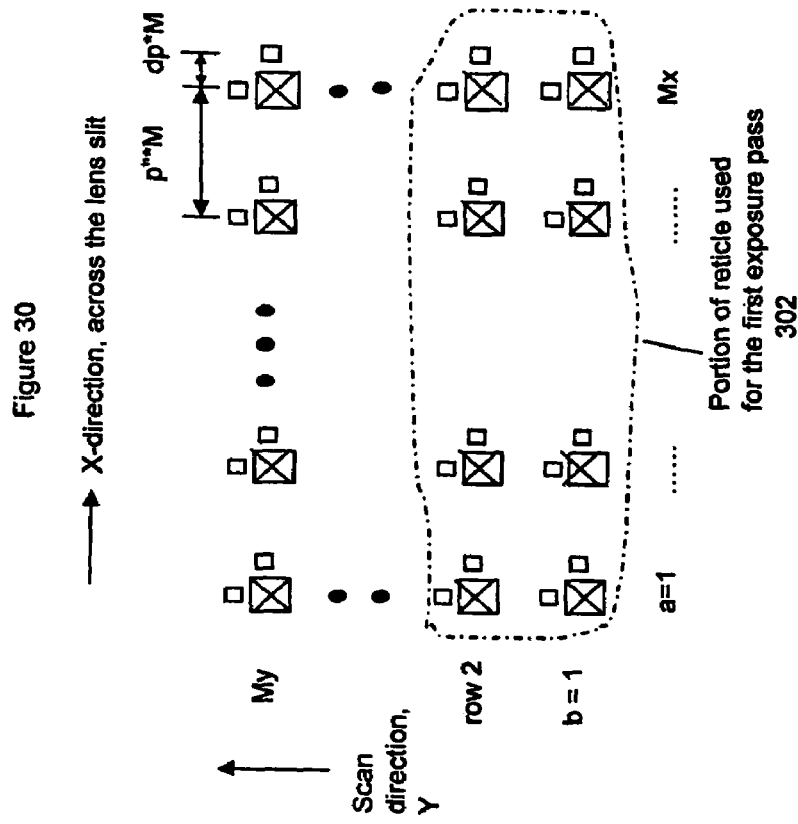
FIG. 30 illustrates the minimal sampling plan for determining the lens distortion associated with a scanner system.

A method for determining the overlay error associated with lens distortion to within a translation, rotation, and x-scale factor in the presence of scanner synchronization error is described See FIG. 16, beginning with a general overview of one embodiment and the mathematical details of the operation. First, as shown in FIG. 2b, a reticle with an (Mx×My) array of overlay groups containing alignment attributes (also called a 4XOL reticle) is loaded into a photolithographic scanner and aligned. Next, a photoresist coated wafer, for example, a positive chemically amplified resist or CAR, is loaded into the machine and aligned with the scanning alignment system. The computer that controls the operation of the machine is programmed to perform a sequence of three unique exposures. Although a full sized reticle is loaded into the scanner the actual size of the exposure field can be varied, as illustrated in FIG. 18, by adjusting the reticle blades such that only a portion of the reticle is exposed at any given time. As described in the mathematics below the actual size of the first scanned exposure field or the number of alignment groups actually printed on the wafer determines the overall accuracy of the lens distortion calculation. FIG. 30 illustrates a region that illustrates a minimal sampling plan for the first exposure of this embodiment; consisting of at least two rows (FIG. 27) (an Mx×2 array) of alignment attributes. FIG. 27 illustrates details of an Mx×2 array.

Following the first exposure the wafer is shifted or sheared (-p"-dp) in the x direction and a second exposure (X-shear exposure) of the reticle is performed. FIGS. 2b, 21, 22, 24, 25, 28, and 29 illustrate details of the first and second exposure on to the wafer. Typical values for "p" are in the range of about 0.5 mm to about 10 mm. Typical values for dp are about 0.02 mm to about 1 mm. The value of "p" is selected such that it be small enough to provide detailed enough coverage of the lens distortion pattern. Stated differently, the lens distortion needs to be sampled at a fine enough interval such that the distortions at the unmeasured locations in between the overlay groups are reasonably approximated (error less than about 30% maximum distortion) by interpolating the values of lens distortion measured on pitch "p". The value of offset dp is selected such that it lies within an area where the lens distortion is not varying significantly. Stated differently, the overlay group of FIG. 23 should lie within an isoplanatic distortion patch of the lens, herein defined as being a region over which the lens distortion varies by less than about 5% of the maximum value of the lens distortion.

Figure 13:
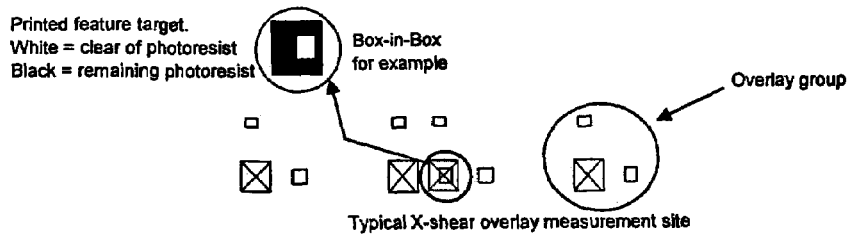
FIG. 13 shows a schematic of X-shear overlay on wafer.
Figure 14A:
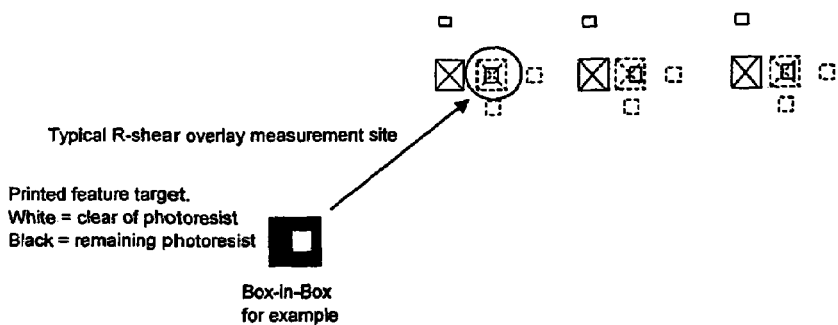
FIG. 14a shows a schematic of a 180 degree R-shear overlay on wafer.
Figure 14B:
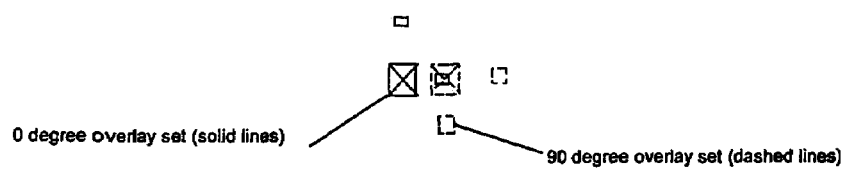
FIG. 14b shows a schematic of a 90 degree R-shear overlay on wafer.
Figure 28:
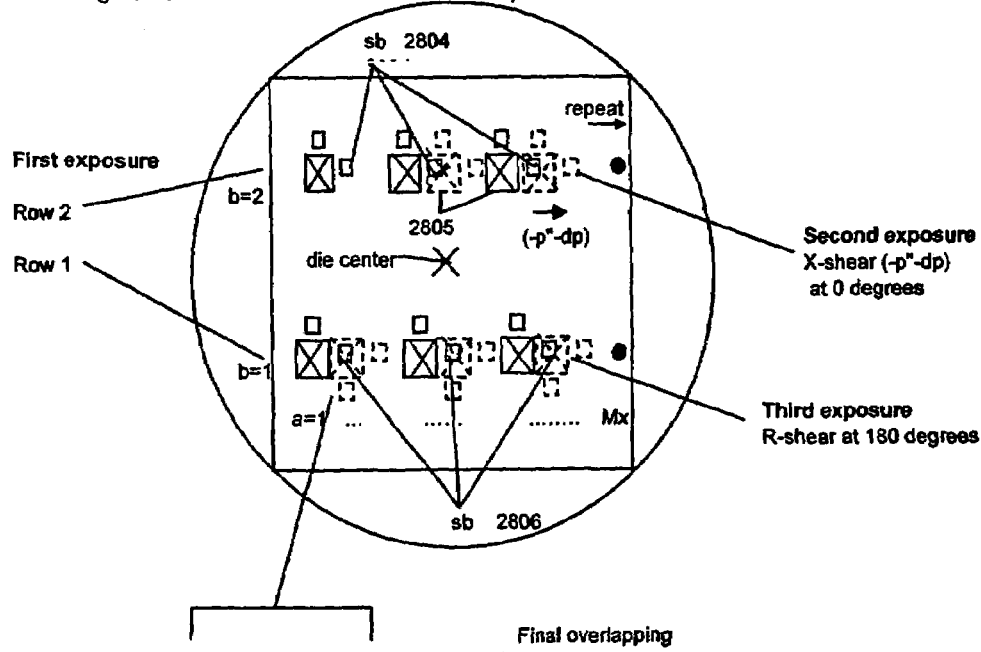
FIG. 28 shows a detailed view of the final two exposure patterns (X-shear, R-shear) for the preferred embodiment.
Figure 29:
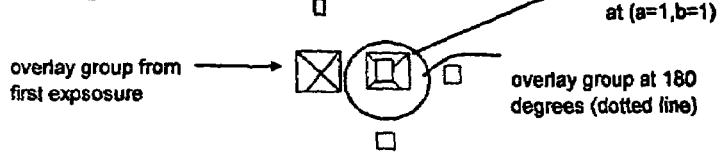
FIG. 29 shows a close-up view of overlay groups used for the third exposure of the preferred embodiment.

The number of rows of alignment attributes exposed during the second or X-shear exposure is typically half of the number of rows exposed during the first exposure. FIG. 28 shows an example of this at row 2. FIG. 13 show the resulting overlapping alignment attributes for a typical 1-row X-shear exposure sequence.

Figure 26:
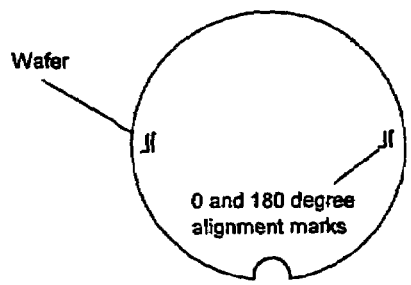
FIG. 26 shows a wafer with alignment marks at 0 and 180 degrees for use with the preferred embodiment.

The final or third exposure sequence (R-shear exposure) consists of rotating the wafer 180-degrees, possibly using wafer alignment marks that have been rotated by 180 degrees, as illustrated in FIG. 26, and exposing the remaining rows, for example row 1 in FIG. 28. This creates a completed alignment attribute as shown in FIG. 28 row 1 and FIG. 14a. The number of rows of alignment attributes for this final R-shear exposure typically consists of half the number of rows exposed during the first exposure. Again, while two rows of alignment attributes are used to describe the method of this embodiment, depending on the further application of the resulting reconstructions, anywhere from the 2 rows illustrated here to all My reticle rows will be printed.

The wafer is then developed. Finally, an overlay metrology tool is used to determine the positional offset error for each overlapping overlay target or alignment attribute. A software algorithm is then used to calculate the lens distortion overlay components independent from the effects of the scanning dynamics the result being a table, such as illustrated in FIG. 37, consisting of the lens distortion as a function of the cross scan (xfn) position.

The mathematical operation for extraction of the distortion components is now described. As noted, overlay error manifests itself as translational offset of the nominal alignment attributes as shown in FIG. 6; by printing arrays of alignment attributes in the method just described it is possible to calculate the contribution of lens distortion in the presence of scanner synchronization error within a translation, rotation, and scale factor.

Equations 12 and 13 above show that the overall overlay distortion error (for each alignment attribute) in the presence of scanner synchronization error and lens distortion is the sum of two vector parts:

$$\delta X(xfn, y) = \Delta XS(yfn) + \Delta xL(xfn), \text{ eq. 13a}$$

$$\delta Y(xfn, yfn) = \Delta YS(yfn) + \Delta yL(xfn) - \Delta YR(xfn, yfn) \quad \text{eq. 13b}$$

Where (xfn, yfn) replace (x,y) as the nominal field position of each individual alignment attribute, See FIG. 1a. Also, $\Delta XS(yfn)$, $\Delta YS(yfn)$, represent the integrated average translational error associated with the scanning dynamics, $\Delta xL(xfn)$, $\Delta yL(xfn)$, represent the translational error associated with lens distortion and $\Delta YR(xfn,yfn)$ represents the integrated scanning average Yaw error ($\Delta YR(xfn,yfn) = xfn * [d\Delta YS(yfn)/dxfn] = xfn*[\theta avg(yfn)]$).

The equations for the locations of the 2*(Mx×2) overlay target boxes following the complete exposure and development sequence are now expressed. The field indices for the alignment attributes are shown in detail in FIGS. 24 and 30. It should be noted that each group of alignment attributes on the reticle consists of three box-in-box structures, as shown in FIG. 2b, and is identified by its row (b=1; My) and column (a=1; Mx) number (group coordinate). After the alignment attributes are printed on the wafer only one overlapping overlay target is created for any given group (See FIG. 13), that can be identified by a unique field position as discussed below.

The positions of the (Mx×2) small outer boxes associated with the first exposure sequence (See small box 2804 of FIG. 28), relative to their nominal positions (xfn,yfn) can be written as a sum of lens distortion, dynamic scanning error, wafer rotation, and wafer translational error;

$$\text{Row 1 position, } 1^{st} \text{ exposure} = [T1x - \theta 1*yfn + \Delta xL(xfn) + \Delta XS(yfn)], [T1y + \theta 1*xfn + \Delta yL(xfn) + \Delta YS(yfn) + xfn*\theta avg(yfn)] \quad \text{eq. 14}$$

$$\text{Row 2 position, 1st exposure} = [T1x - \theta 1*yfn' + \Delta xL(xfn) + \Delta XS(yfn')], [T1y + \theta 1*xfn + \Delta yL(xfn) + \Delta YS(yfn') + xfn*\theta avg(yfn')] \quad \text{eq. 15}$$

Where T1x and T1y are unknown field translations and θ1 is an unknown field rotation. Note: the single prime symbol "'" highlights the fact that the scanning error in row 2 is different from row 1.

The positions of the (Mx×1) large inner boxes associated with the second X-shear exposure sequence, illustrated in FIG. 28 row 2 dashed boxes 2805, relative to their nominal positions (xfn,yfn) can be written as a sum of errors as before;

$$\text{Row 2 position, } 2^{nd} \text{ or X-shifted exposure} = [T2x - \theta 2*yfn' + \Delta xL(xfn-\Delta) + \Delta XS2(yfn')], [T2y + \theta 2*xfn + \Delta yL(xfn-\Delta) + \Delta YS2(yfn') + xfn*\theta avg2(yfn')] \quad \text{eq. 16}$$

Where T2x and T2y are unknown field translations, θ2 an unknown rotation, $\Delta=(-p'')$, (See FIG. 28), and the dynamic scan induced error terms ($\Delta XS2$, $\Delta YS2$, $\theta avg2$) are distinctly different from those of the $1^{st}$ exposure and this is denoted by their suffix, 2.

The positions of the (Mx×1) large inner boxes associated with the third R-shear exposure sequence, illustrated in FIG. 28 row 1, dashed boxes 2806, relative to their nominal positions (xfn,yfn) can be written as a sum of errors as before:

$$\text{Row 1 position, } 3^{rd} \text{ or 180 degree rotated exposure} = [T3x - \theta 3*yfn - \Delta xL(-xfn) + \Delta XS3(yfn)], [T3y + \theta 3*xfn - \Delta yL(-xfn) + \Delta YS3(yfn) + xfn*\theta avg3(yfn)] \quad \text{eq. 17}$$

Where T3x and T3y are unknown field translations, θ3 an unknown rotation, and the dynamic scan induced error terms ($\Delta XS3$, $\Delta YS3$, $\theta avg3$) are distinctly different from those of the $1^{st}$ and $2^{nd}$ exposures and this is denoted by their suffix, 3.

Finally, the measured offsets for the X-shear exposure is just the difference of Equations 16 and 14 or:

$$BBX(a,2,X) = [(T2x - T1x + \Delta XS2(yfn') - \Delta XS(yfn')) - (\theta 2 - \theta 1)*yfn' + \Delta xL(xfn-\Delta) - \Delta xL(xfn)] \quad \text{eq. 18}$$

$$BBY(a,2,X) = [(T2y - T1y + \Delta YS2(yfn') - \Delta YS(yfn')) + (\theta 2 - \theta 1 + \theta avg2(yfn') - \theta avg(yfn'))*xfn + \Delta yL(xfn-\Delta) - \Delta yL(xfn)] \quad \text{eq. 19}$$

Where we use BBX(a,2,X) and BBY(a,2,X) to denote the X-shear overlay error for the overlapping alignment attributes (Box-in-Box structures) located at (a,b=2) or row 2 of FIG. 28.

The measured offsets for the R-shear exposures (the difference between the large boxes in row 1 from the R-shear exposure and the small boxes in row 1 from the first exposure)=Equation 17–Equation 15 or;

$$BBX(a,1,R) = [(T3x - T1x + \Delta XS3(yfn) - \Delta XS(yfn)) - (\theta 3 - \theta 1)*yfn - \Delta xL(-xfn) - \Delta xL(xfn)]; \quad \text{eq. 20}$$

$$BBy(a,1,R) = [(T3y - T1y + \Delta YS3(yfn) - \Delta YS(yfn)) + (\theta 3 - \theta 1 + \theta avg3(yfn) - \theta avg(yfn))*xfn - \Delta yL(-xfn) - \Delta yL(xfn)] \quad \text{eq. 21}$$

Where we use BBx(a,1,R) and BBy(a,1,R) to denote the R-shear overlay error for the overlapping alignment attributes (Box-in-Box structures) located at (a,b=1). See FIG. 28.

Equations 18–21 are typically solved using the singular value decomposition to produce the minimum length solution. See Numerical recipes, The Art of Scientific Computing, supra. They are typically over-determined in the sense of equation counting (there are more equations than unknowns) but are still singular in the mathematical sense; there is an ambiguity in the solution of these equations. The unknowns in Equations 18–21 are the intra-field distortion map $\Delta xL(xfn)$, $\Delta yL(xfn)$, all of the scanner dynamic and yaw errors ($\Delta XS(yfn),\Delta YS(yfn),\theta avg(yfn)$). ($\Delta XS2(yfn'), \Delta YS2(yfn'),\theta avg2(yfn'))$), etc., and the field translations and rotations (T1x,T1y,θ1 . . . T3x,T3y,θ3). It can be mathematically shown that we can solve for the distortion map ($\Delta xL(xfn),\Delta yL(xfn)$) uniquely to within a translation, rotation, and x-scale factor.

From the X-shear overlay measurements alone, we can determine the lens distortion, $\Delta xL(xfn)$, $\Delta yL(xfn)$ to within:

$$\Delta xL(xfn) = A + B*xfn \quad \text{eq. 22}$$

$$\Delta yL(xfn) = C + D*xfn + E*xfn^2 \quad \text{eq. 22a}$$

where A, B, C, D, and E are unknown constants.

This follows from setting up the linear equations for each overlapping alignment attribute and solving an over-determined system of equations as noted above. By including the R-shear overlay measurements we eliminate some noise in the calculations (by including more data) and in addition E is determined. Hence by combining the X-shear and R-shear measurements we can determine the lens distortion to within:

$$\Delta xL(xfn) = A + B*xfn \quad \text{eq. 23}$$

$$\Delta yL(xfn) = C + D*xfn \quad \text{eq. 23a}$$

Interpretation of the Unknown Constants (A,C)=(x,y), the intra-field translation contribution due to the scanner projection lens. Because there is also a translational scanning error contribution it can be included with this unknown translational constant into the unknown scanning error (ΔXS(yfn),ΔYS(yfn)) which is disregarded for the purposes of this analysis. In addition, the wafer stage can also be the source of this error.

B=x–intra-field scale or magnification factor. This must be determined using other techniques, it remains unknown for the purposes of the present invention.

D=intra-field rotation. Since the Yaw term (ΔYR(xfn, yfn)=xfn*[dΔYS(yfn)/dx]=xfn*[θavg(yfn)]) also has a xfn term we can absorb this factor into the scanning yaw term. In addition, the wafer stage can also induce intra-field rotation errors.

Therefore, using the method of this embodiment we can uniquely determine the lens distortion components in the presence of scanning synchronization error within a translation, rotation and x-scale factor. The translation, rotation and x-scale must be determined otherwise. Having accomplished the last step in the process of this embodiment the final results of the intra-field lens distortion in the presence of scanner synchronization error can be recorded in tabular form as illustrated in FIG. 37.

Embodiment for Determining Reticle Stage Grid and Yaw Error

In a step and scan system (see, for example, J. Bruning, "Optical Lithography—Thirty years and three orders of magnitude", *SPIE*, Vol. 3051, pp. 14–27, 1997), at each printed exposure field, the wafer stage and reticle stage simultaneously and precisely move in coordination over a fixed rectangular field of view (slot S in FIG. 39). To the extent there are imperfections in this simultaneous movement (that is, if there are synchronization errors), a distortion of the projected pattern will occur which can be measured by the method described in A. Smith et al., "Method and Apparatus for Self-Referenced Dynamic Step and Scan Intra-Field Scanning Distortion", U.S. Pat. No. 6,906,780, issued Jun. 14, 2005. This technique measures the combined wafer and reticle stage synchronization error. While this error (especially its average, or repeatable part) can be directly used as a correction to the scan servomechanism (see, for example, A. Smith et al., "Process for Amelioration of Scanning Synchronization Error", U.S. patent application Ser. No. 10/844,757, filed May 12, 2004), the measurement of U.S. Pat. No. 6,906,780, supra, cannot discriminate what portion of the observed synchronization error is due to the wafer stage or due to the reticle stage. Knowledge of the contributions of individual subsystems to the scan synchronization error can be used to optimize the performance of step and scan systems and it would thus be desirable to separate out the individual subsystem contributions to this error.

In one embodiment a reticle stage portion of the synchronization error, such as grid and yaw error, of a projection imaging tool may be determined using self-referenced techniques. These techniques are independent of static lens distortion and wafer stage positioning errors. To determine the error, an overlay reticle containing an array of overlay groups is provided. Next, a photoresist coated wafer is inserted into the projection lithography tool under examination and the wafer is stepped to a desired position. Using only the reticle stage, the overlay reticle is then successively shifted and exposed in a one-dimensional interlocking pattern creating columns of printed, completed alignment attributes. The completed alignment attributes may then be measured on an overlay tool. The resulting overlay measurements may then be fed into a computer program and reconstruction of the reticle stage portion of the synchronization error, such as grid and yaw, to within a translation and rotation determined.

Except for the initial wafer positioning, the fact that we are using the reticle stage only for the exposure sequence is what allows us to uniquely separate and extract the contribution of the reticle stage to distortion. What we are in particular measuring is imperfections in the reticle stage mirror and interferometer subsystem.

Figure 38:
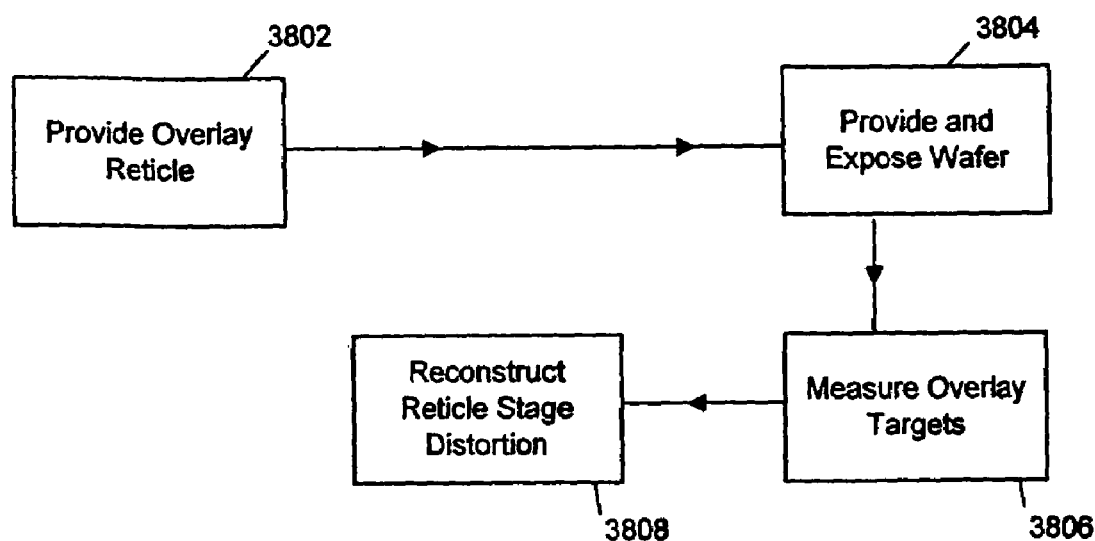
FIG. 38 is a flow chart illustrating determination of a scanner reticle stage grid and yaw error.

FIG. 38 is a flow chart illustrating determination of a scanner reticle stage grid and yaw error. As shown in FIG. 38 flow begins in block 3802 where an overlay reticle is provided. Flow continues to block 3804 where the overlay reticle is used to expose a substrate, or wafer. Then in block 3806 measurements are made of overlay targets that result from exposing the reticle onto the wafer. Then in block 3808 a reconstruction of the reticle stage distortion is determined. Additional details of determination of a scanner reticle stage grid and yaw error are described below.

Figure 39:
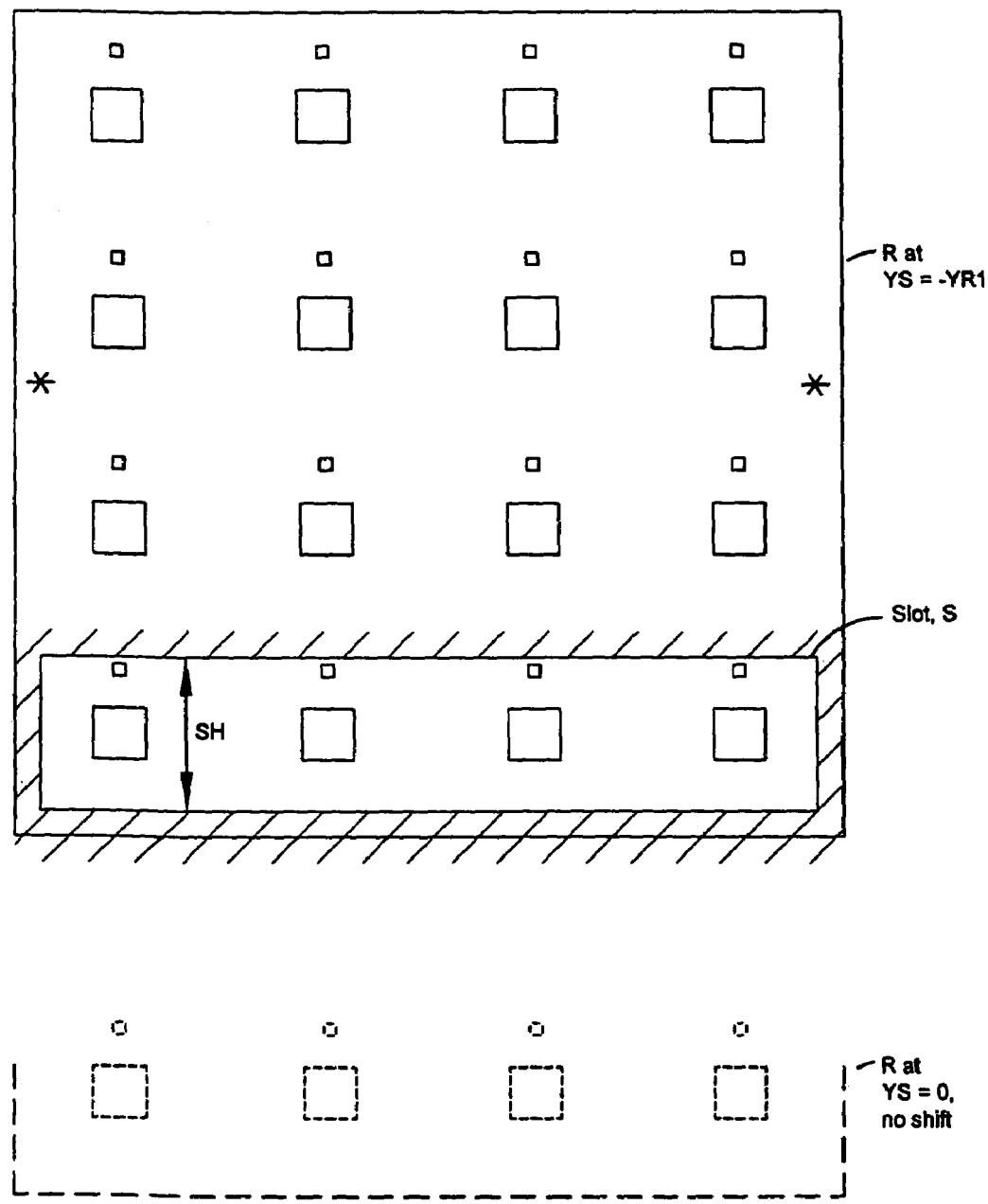
FIG. 39 is a block diagram illustrating the reticle R shifted by reticle table RT so that row iY=1 is centered in exposure slot S.
Figure 40:
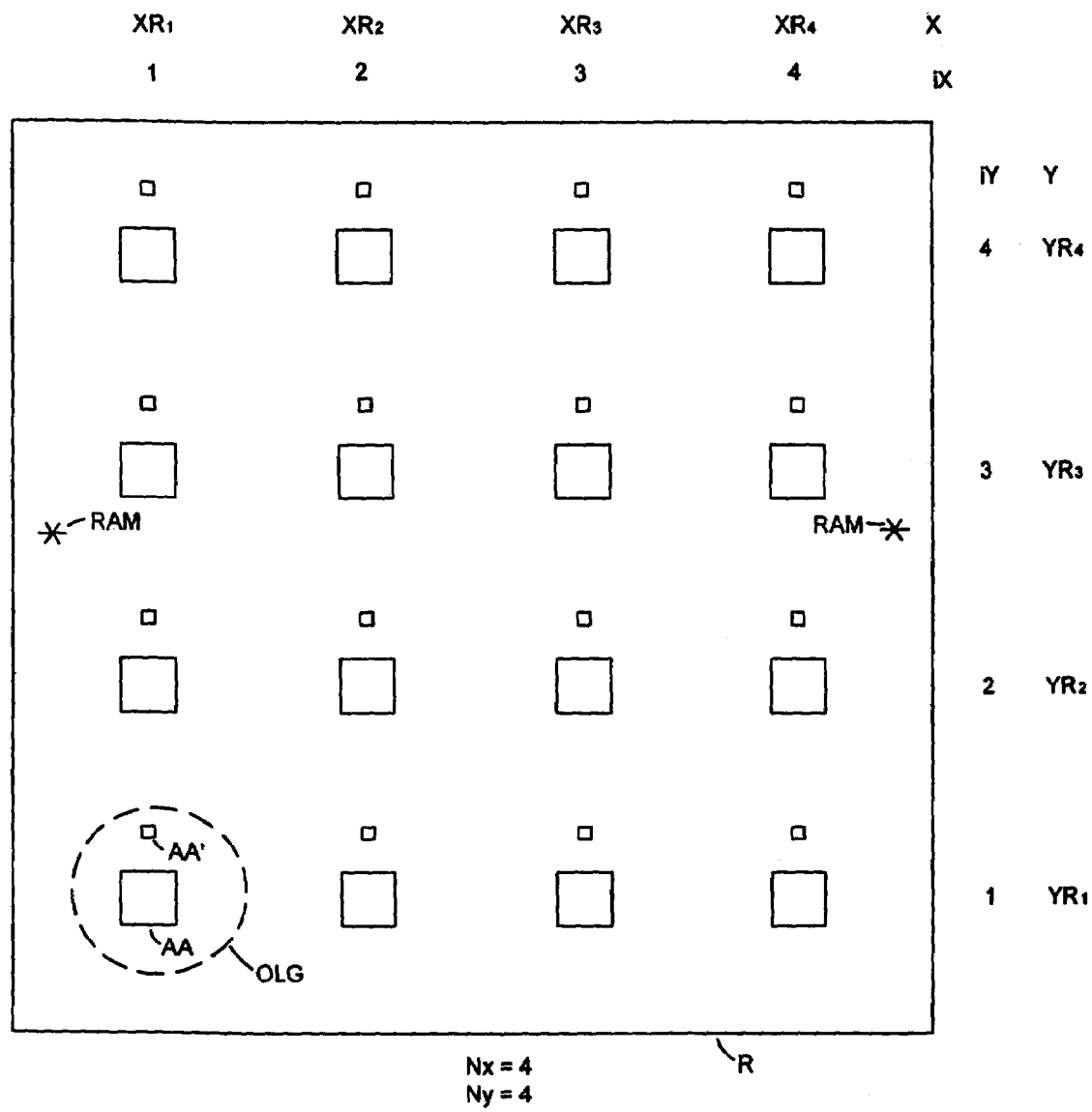
FIG. 40 shows a schematic of an exemplary overlay reticle R that could be used in the technique described in FIG. 38.

FIG. 40 shows a schematic of an exemplary overlay reticle R that could be used in the technique described in FIG. 38. As shown in FIG. 40, the reticle R includes overlay groups OLG arrayed in rows and columns. In the exemplary reticle illustrated in FIG. 40, a 4×4 array of overlay groups is shown. FIG. 39 is a block diagram illustrating the reticle R shifted by reticle table RT so that row iY=1 is centered in the exposure slot S.

Figure 41:
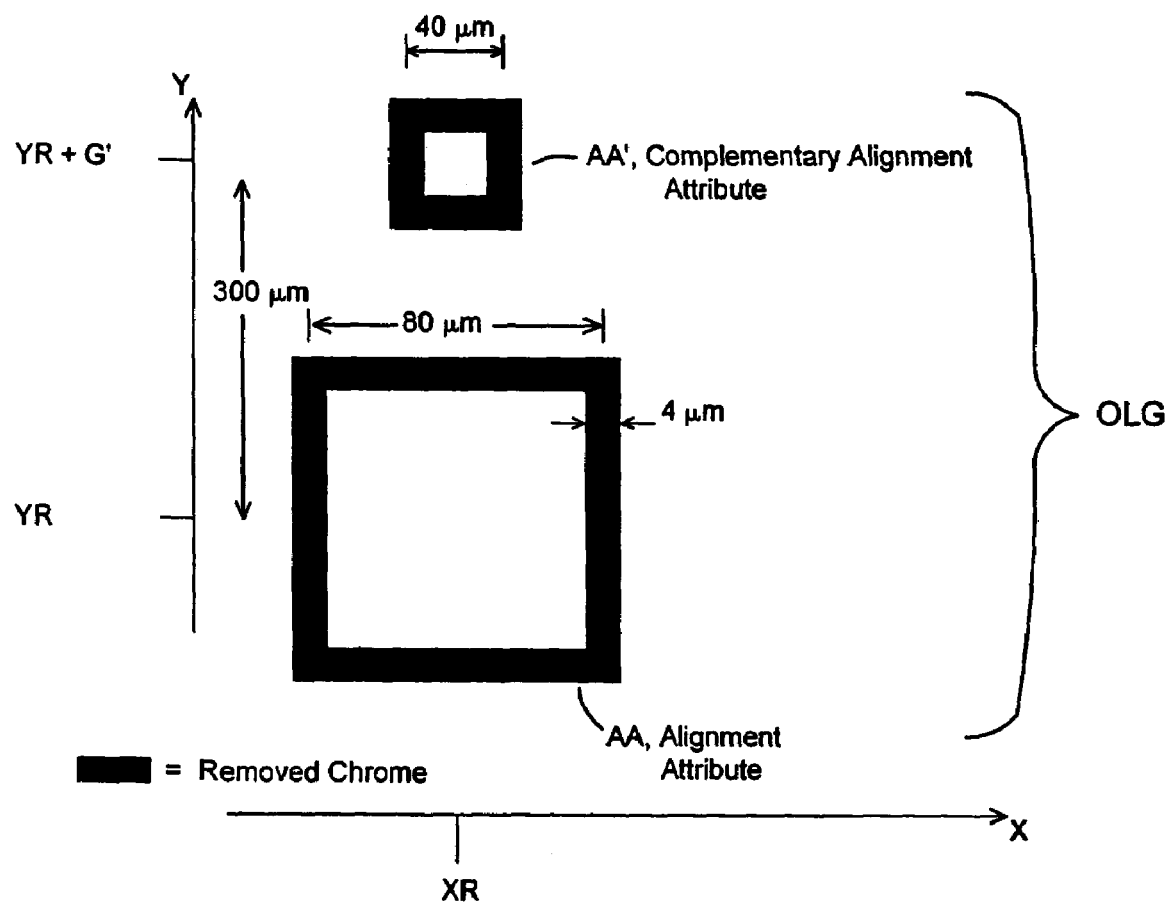
FIG. 41 is a schematic illustrating further detail of an exemplary overlay group OLG.

FIG. 41 is a schematic illustrating further detail of an exemplary overlay group OLG. As illustrated in FIG. 41, the overlay group OLG includes an alignment attribute AA and a complementary alignment attribute AA'. In the example of FIG. 41, the alignment attribute AA is an outer bar pattern, and the complementary alignment attribute AA' is an inner bar pattern. The alignment attribute AA and the complementary attribute AA' are offset in a direction Y by an amount G'. Exemplary dimensions for the alignment attribute AA and complementary alignment attribute AA' are 80 μm and 40 μm respectively with a trace width of 4 μm, as illustrated in FIG. 41.

In block 3804 of FIG. 38, a wafer is exposed. In one embodiment, a photoresist coated wafer, W, is provided. Only a bare wafer is required, no wafer alignment marks or reference grids are needed. Using a wafer stage the wafer W is stepped to a desired exposure field and stopped. Then, during the exposure sequence only the reticle stage is moved. Next, row 1 (IY=1 in FIG. 40) on reticle R is shifted an amount (in reticle coordinates) YS(1)=−YR(1) and exposed. Then in succession we expose rows IY=2:NY by shifting reticle R an amount:

$$YS(IY) = -YR(IY) + (IY-1)*G' \qquad \text{eq. 24)}$$

and doing a static exposure. What results is an NX×(NY−1) array of printed completed alignment attributes "PCAA."

An example of exposing a wafer includes using blades, or other devices, to cover the reticle that includes a first set of attributes and a second set of attributes that are complementary. The blades are positioned such that only a single row of complementary paired attributes, comprising a row of alignment attributes and a row of complementary attributes, is exposed. The reticle stage is then shifted in a desired direction, such as in the scan direction. The blades covering the reticle are then adjusted so that the next row of complementary paired attributes, comprising a row of alignment attributes and a row of complementary attributes, is exposed. The second exposure of alignment attributes align and interlock with the first exposure of alignment attributes to form printed completed alignment attributes. The shifting, adjusting, and exposing can be performed a desired number of times.

Figure 42:
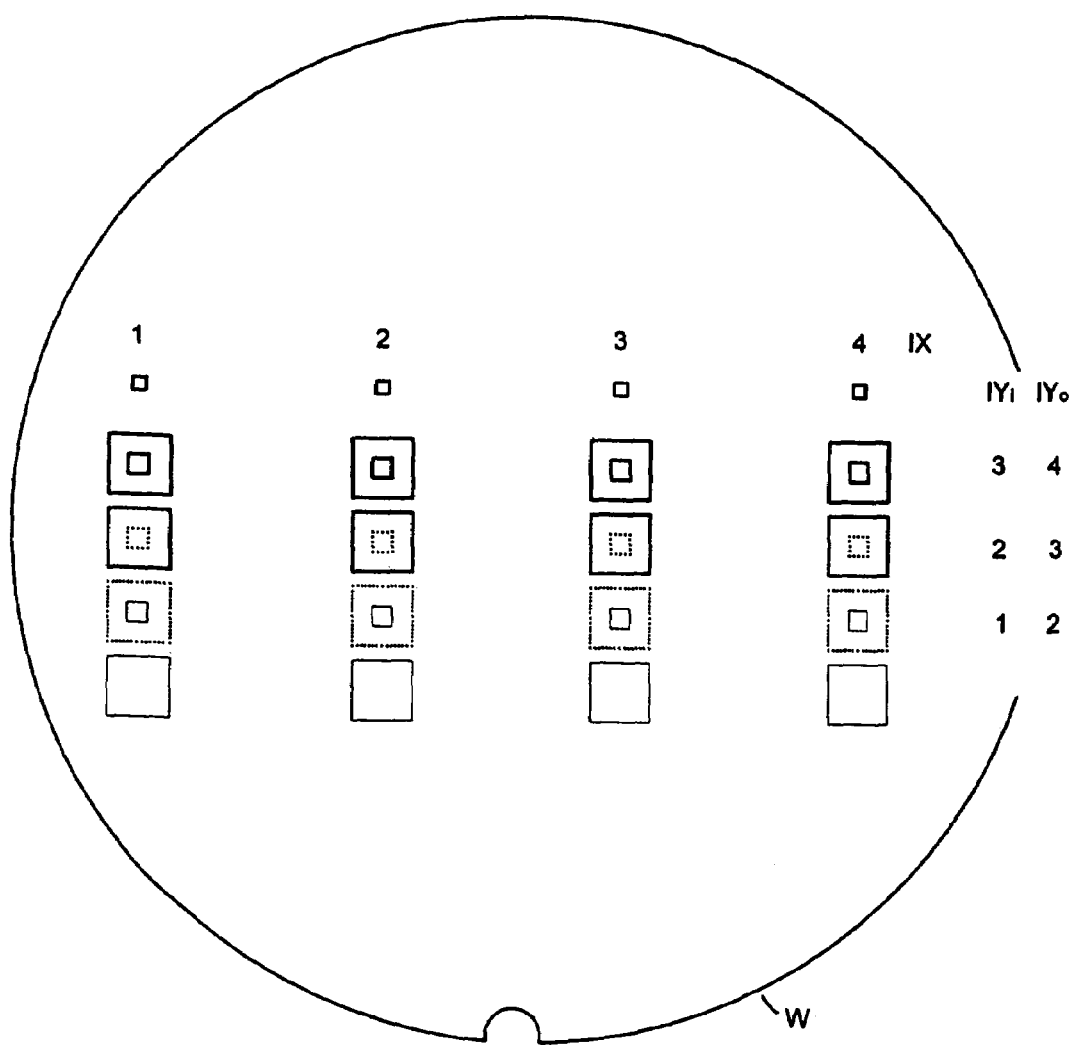
FIG. 42 is a schematic illustrating an array of printed completed alignment attributes PCAA.
Figure 43:
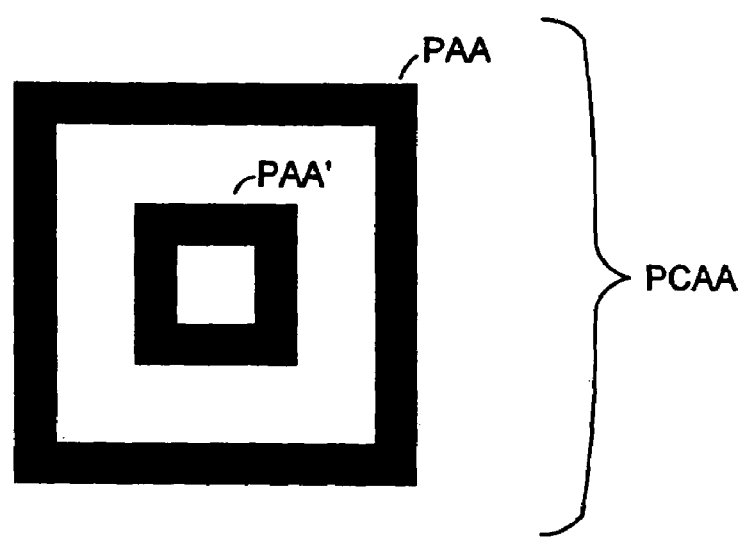
FIG. 43 is a schematic showing details of a printed completed alignment attribute PCAA.

FIG. 42 is a schematic illustrating an array of NX×(NY−1) array of printed completed alignment attributes PCAA (NX=4, NY=4). In FIG. 42, the lightest lined boxes are first exposed by shifting the row IY=1 (reticle of FIG. 40) so as to lie within imaging slot S (FIG. 39). Next, the row IY=2 of FIG. 40 is shifted by −YR (2)+G' so that its outer boxes (dotted lines) overlap the lightest lined inner boxes laid down in the previous step. What results is a row of completed alignment attributes with inner boxes from the IY=1 row of the reticle (Iyi=1) and outer boxes from the IY=2 row of the reticle (Iyo=2). In similar manner, the succeeding rows of completed alignment attributes are created utilizing rows 3 and 4 of the reticle, the final result being shown in FIG. 42. FIG. 43 is a schematic showing details of a printed completed alignment attribute PCAA. As shown in FIG. 43 the printed completed alignment attribute includes a printed alignment attribute PAA and a printed complementary alignment attribute PAA'. All of these exposures described are static; that is, there is no movement of the wafer stage over the course of the exposures.

When done, the wafer is taken off the wafer stage and developed.

After the series of exposures are completed, the NX×(NY−1) array of printed completed alignment attributes, PCAA, are measured (Block 3806 in FIG. 38). The overlay measurements are denoted as:

(BBX, BBY)(IYi, IYo;IX)=overlay measurement corresponding to inner box from row, column=(IYi, IX) of reticle and outer box from row, column=(IYo, IX) of reticle R. (See FIG. 42 for reference).

Using the overlay measurements a reticle stage distortion is reconstructed (Block 3808 of FIG. 38). A model for the overlay measurements is:

$$(BBX, BBY)(IYi, IYo;IX)=(dXi, dYi)(IYi,IX)-(dXo, dYo)(IYo,IX) \quad \text{eq. 25}$$

where:

$$(dXi,dYi)(IX,IY)=\text{total displacement of inner box from row } IY, \text{column } IX=(dXWi,dYWi)(IX,IY)+(dXLi,dYLi)(IX,IY)+(dXRSi,dYRSi)(IX,IY)$$

and similarly for the outer box displacement (dXo, dYo).

dXWi, dYWi is the wafer stage displacement contribution to the inner box and it is given by:

$$(dXWi, dYWi)(IX,IY)=\text{wafer stage displacement}= (TxWS-QWS*XR(IX)/M, TyWS+QWS*(YR(IY)+G9+YS(IY)/M)=(TxWS-QWS*XR(LX)/M, TyWS+QWS*IY*G9/M) \quad \text{eq. 26}$$

Similarly, the wafer stage contribution to the outer box position is given by:

$$(dXWo, dYWo)(IX,IY)=(TxWS-QWS*XR(IX)/M, TyWS+QWS*(IY-1)*G9/M) \quad \text{eq. 27}$$

Combining Equations 25 and 26 and using the fact that WYo=WYi+1, the total wafer stage contribution to Equation 25 is eliminated. This is what is expected because the wafer stage is not moved during the exposures and therefore, it should not influence overlay measurements.

Next, the lens contribution is simply a function of the position within the static lens field (dxSL,dySL)(X,Y). So we get:

$$(dXL_i, dYL_i)(IX, IY_i) = (dxSL, dySL)\left(\frac{XR(IX)}{M}, IY_i^* \frac{G'}{M}\right) \quad \text{eq. 28}$$

$$(dXL_o, dYL_o)(IX, IY_o = IY_i + 1) = (dxSL, dySL)\left(\frac{XR(IX)}{M}, IY_i^* \frac{G'}{M}\right) \quad \text{eq. 29}$$

and the contribution of static lens aberrations vanishes. This is intuitively clear since we are shooting the AA and AA' through exactly the same part of the lens.

Contribution of reticle stage grid and yaw is:

$$(dXRS_i, dYRS_i)(IX, IY_i) = \quad \text{eq. 30}$$
$$\left(TXRS(IY_i) - \frac{G'}{M}QRS(IY_i), TYRS(IY_i) + \frac{XR(IX)}{M}*QRS(IY_i)\right)$$

and $$(dXRS_o, dYRS_o)(IX, IY_o = IY_i + 1) = \quad \text{eq. 31}$$
$$\left(TXRS(IY_i + 1), TYRS(IY_i + 1) + \frac{XR(IX)}{M}*QRS(IY_i + 1)\right)$$

where;
(TXRS, TYRS, QRS) (IY)=reticle stage translation and yaw error for inner box exposure IY$_i$=IY.

Taking Equations 30 and 31, we can write the resulting overlay measurements in terms of (TXRS, TYRS, QRS) as:

$$(BBX, BBY)(IY, IY+1; IX) = \quad \text{eq. 32}$$
$$\left[\left(TXRS(IY) - TXRS(IY+1) - \frac{G'}{M}QRS(IY), TYRS(IY) - TYRS(IY+1) + \frac{XR(IX)}{M}(QRS(IY) - QRS(IY+1))\right)\right]$$

Equation 32 can be solved by singular value decomposition (see, for example, W. Press et al., "Numerical Recipes, The Art of Scientific Computing", *Cambridge University Press*, pp. 52–64, 1990). There is a three-fold ambiguity in the solution of Equation 9, namely we can determine the reticle stage grid and yaw errors to within a net translation and rotation. Put differently, if (TXRS, TYRS, QRS) (IY) solves Equation 32 then so does (TXRS, TYRS, QRS) (IY)+(A, B, C) where A, B, C are constants independent of IY. This last statement is strictly true if we neglect the G'/M term in Equation 32. This term is a small correlation that in principle (with zero noise measurements) could determine the rotation but in practice would result in a low quality result. Hence, we regard this mode as indeterminate. So, if we have a particular solution to Equation 32, (TXRS9, TYRS9, QRS9) (IY), we get a unique solution by removing the average translation and rotation, e.g., $$TXRS(IY)=TXRS'(IY)-\text{AVG}(TXRS') \quad \text{eq. 33}$$

and similarly for TYRS QRS.

Figure 44:
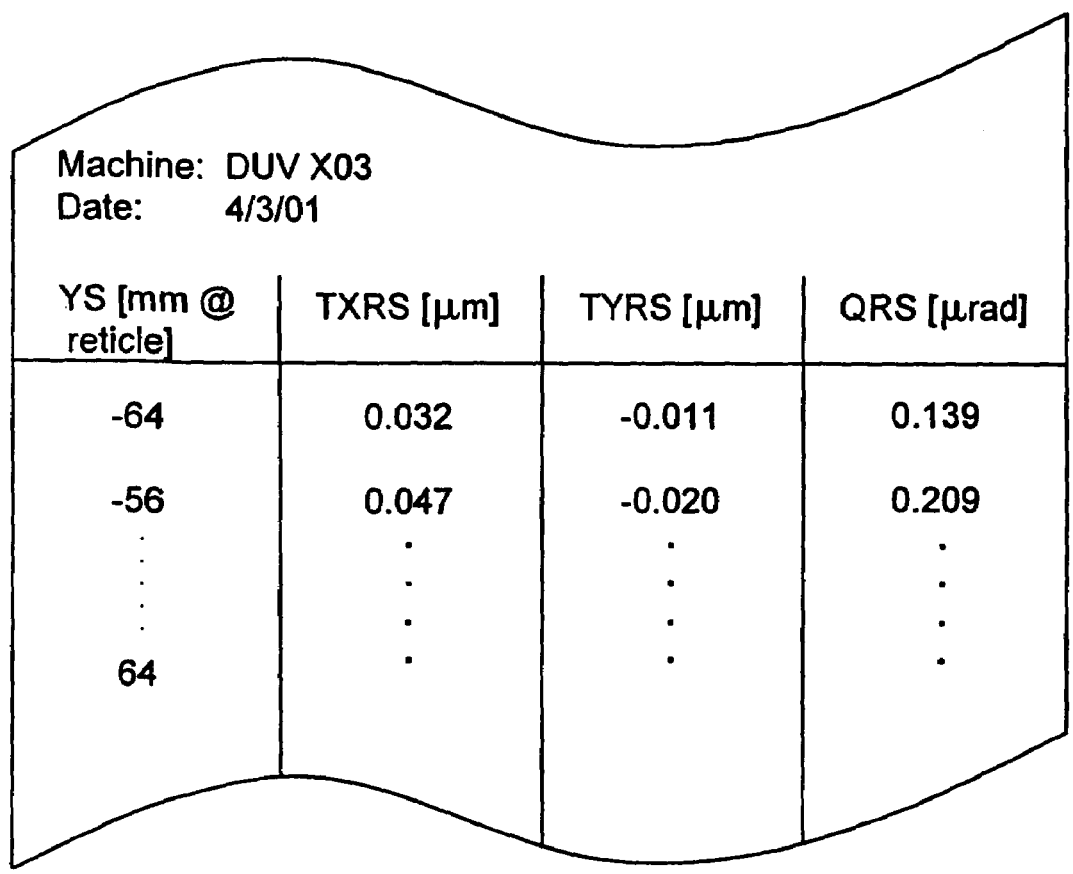
FIG. 44 is an exemplary final output of the techniques for determining reticle stage grid and yaw as a function of reticle shift.

FIG. 44 is an exemplary final output of the techniques for determining reticle stage grid and yaw as a function of reticle shift.

Alternative Embodiments for Determining Reticle Stage Grid and Yaw Error

In another embodiment, exposing a wafer includes using blades, or other devices, to cover the reticle such that only a single row of complementary paired attributes, comprising a row of alignment attributes and a row of complementary attributes, is exposed. The reticle stage is then shifted in a desired direction, such as in the scan direction. The blades covering the reticle are then adjusted so that a non-successive row of complementary paired attributes, comprising a row of alignment attributes and a row of complementary attributes, is exposed. That is, the non-successive row is not the next row, but some other row of complementary paired attributes on the reticle. The second exposure of alignment attributes align and interlock with the first exposure of alignment attributes to form printed completed alignment attributes. The shifting, adjusting, and exposing can be performed a desired number of times.

In yet another embodiment, a single row, say Row 1, could be exposed, the reticle then shifted and Row 2 exposed over the exposure of Row 1 (with a reticle stage move only). Then, step (with the wafer stage) to another field, expose Row 1 and then Row 3 on top of it. Repeating until all rows of interest are exposed, the box-in-box measurements then give, directly, the difference between Row IY and Row 1 in TXR, TYR, QR. Calling the measured difference between Row 1 and itself zero, we can then remove the average translation and rotation from the collection TXR, TYR, QR (vide supra) to arrive at our reconstructed results.

In still another embodiment, a reduced transmission reticle can be used (see, for example, A. Smith et al., "Method and Apparatus for Self-Referenced Wafer Stage Positional Error Mapping", U.S. Pat. No. 6,734,971, issued May 11, 2004) for overlay reticle R and the reticle stage motions repeated on a single field to get only the repeatable part of (TXR, TYR, QR). Also, sub-E0 exposures as described in U.S. Pat. No. 6,734,971, supra could be used.

In yet another embodiment, the minimum height we can adjust the exposure slot height (SH in FIG. 39) to is so big that two or more rows of reticle R are simultaneously exposed. In this case we will accumulate interlocking exposure sets as in FIG. 42 but these will now be one set for each of the rows exposed or revealed by slot height SH. For the measurement and reconstruction we can proceed as previously for each interlocking exposure set and use them separately or average the results together.

To summarize, the reticle stage portion of the synchronization error, such as grid and yaw error, of a projection imaging tool may be determined using self-referenced techniques. These techniques may be independent of static lens distortion and wafer stage positioning errors. An overlay reticle including an array of overlay groups is provided. Next, a photoresist coated wafer is inserted into the projection lithography tool under examination and the wafer stepped to a specified position. Using only the reticle stage, the overlay reticle is then successively shifted and exposed in a one-dimensional interlocking pattern creating columns of printed, completed alignment attributes. The completed alignment attributes are then measured on an overlay tool. The resulting overlay measurements are then used to reconstruct the reticle stage portion of the synchronization error of the projection imaging tool. For example, the overlay measurements could be used to reconstruct the reticle stage grid and yaw error to within a translation and rotation.

Figure 49:
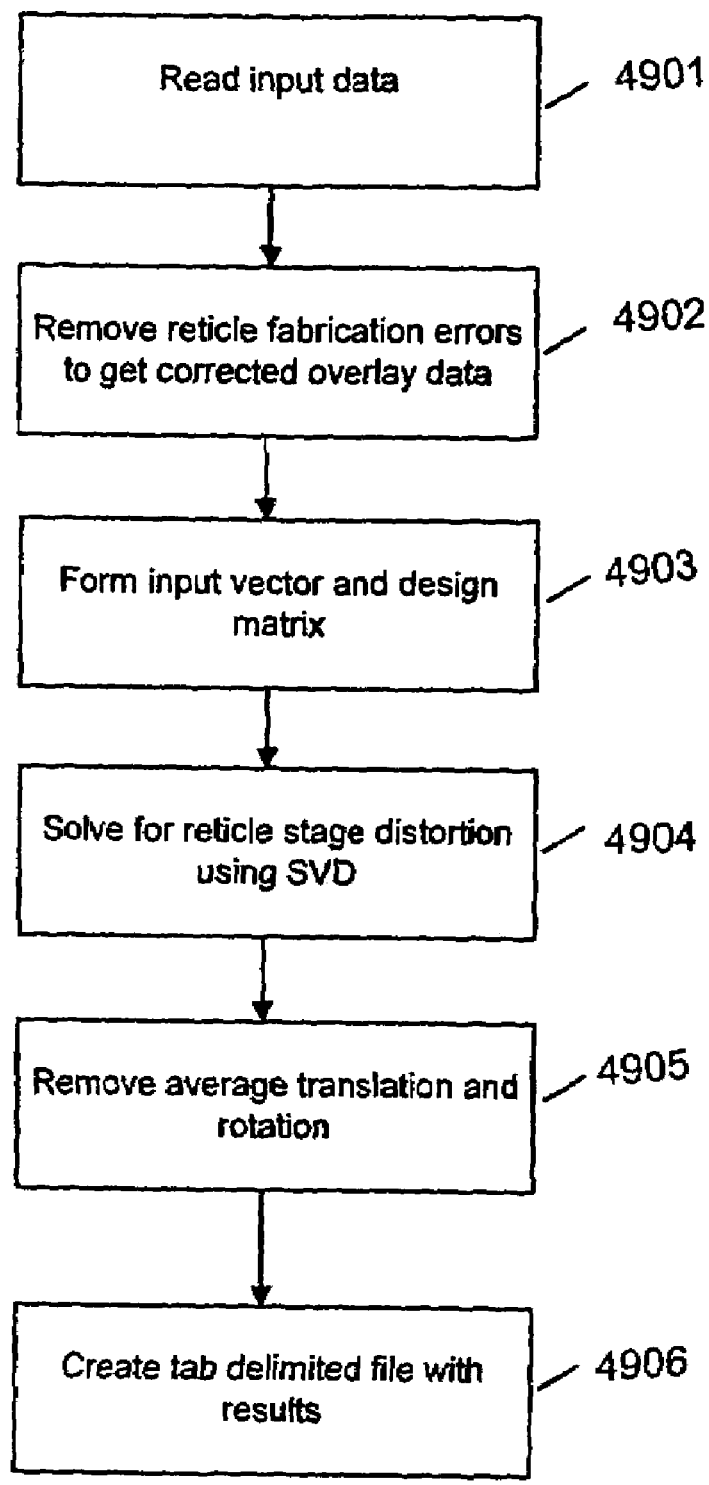
FIG. 49 illustrates a block diagram of a computer program for carrying out reticle stage distortion reconstruction.

The reconstruction steps outlined herein can be incorporated into a computer program whose general outline is FIG. 49. First, Block 4901, the input data is read in. It includes the columnular table shown in FIG. 50. Entries IX, $IY_i$, $IY_o$, BBX, BBY are as previously described while:

XR=X-position on reticle of inner and outer box
$YR_i$, $YR_o$=Y-position on reticle of inner, outer box
$DXR_i$, $DYR_i$=X,Y reticle fabrication error for inner box
$DXR_o$, $DYR_o$=X,Y reticle fabrication error for outer box
I=consecutive index for each data line.

There are ND=NX*(NY−1) data lines in this table.

The input data are preferably sorted or preorganized so that the list is in ascending order on IX and next in ascending order in $IY_i$.

Next, Block 4902 of FIG. 49, the reticle error is removed from the overlay data. Since we internally store each column of data as an array with index I running from 1: ND, this enables the replacements:

$$BBX(I) \rightarrow BBX(I)-(DXR_i(I)-DXR_o(I))/M \qquad \text{eq. 34)}$$

$$BBY(I) \rightarrow BBY(I)-(DYR_i(I)-DYR_o(I))/M \qquad \text{eq. 35)}$$

The 2*ND length input vector (Block 4903) consists of the reticle corrected box-in-box measurements:

$$V(1:2*ND)=(BBX(1), BBY(1), BBX(2), BBY(2), \ldots BBX(ND), BBY(ND)) \qquad \text{eq. 36)}$$

Design matrix D (ir, ic) consists of ir=1:2*ND rows and ic=1:3*NY columns. Writing D with a column ordering of:

$$W=TXRS(1)\ TYRS(1)\ QRS(1)\ TXRS(2)\ldots QRS(NY) \qquad \text{eq. 36.1)}$$

We can look to Equation 32 to read off our matrix elements for D. Thus, in row $$ir=2*[IY_i+(IX-1)(NY-1)]-1(IY_i=1:NY-1,\ IX=1:NX) \qquad \text{eq. 37}$$

the only non-zero matrix elements are in columns:

$$ic1=1+3*(IY_i-1) \qquad \text{eq. 38)}$$

$$ic2=4+3*(IY_i-1) \qquad \text{eq. 39)}$$

$$ic3=3+3*(IY_i-1) \qquad \text{eq. 40)}$$

and have values:

$$D(ir, ic1)=1 \qquad \text{eq. 41)}$$

$$D(ir, ic2)=-1 \qquad \text{eq. 42)}$$

$$D(ir, ic3)=-G'/M \qquad \text{eq. 43)}$$

In row:

$$ir=2*[IY_i+(IX-1)(NY-1)](IY=1:NY-1,\ IX=1:NX) \qquad \text{eq. 44)}$$

the only non-zero matrix elements are in columns ic1, ic2, ic3 (supra) and $$ic4=6+3*(IY_i-1) \qquad \text{eq. 45)}$$

with values:

$$D(ir, ic1) = 1 \qquad \text{eq. 46)}$$

$$D(ir, ic2) = -1 \qquad \text{eq. 47)}$$

$$D(ir, ic3) = \frac{XR(IX)}{M} \qquad \text{eq. 48)}$$

$$D(ir, ic4) = \frac{-XR(IX)}{M} \qquad \text{eq. 49)}$$

Having formed the input vector (Equation 36) and design matrix (Equations 37–49) we move from Block 4903 to 4904 and solve for the unknowns (Equation 36.1). The preferred technique is the singular value decomposition (supra). The public domain Fortran 77 LAPACK driver routine SGESVD (Reference 1000) can be used to carry out decomposition of design matrix D into the form:

$$D = U \Sigma R^T \qquad \text{eq. 50}$$

Where U is a 2*ND×2*ND orthogonal matrix, Σ is a diagonal 2*ND×3*NY matrix and R is a 3*NY×3*NY orthogonal matrix. All three of these matrices are produced by routine SGESVD. The diagonal elements (singular values) of Σ are $\sigma_1, \sigma_2, \ldots \sigma_{3*NY-3}, \sigma_{3*NY-2}, \sigma_{3*NY-1}, \sigma_{3*NY}$ and are sorted in descending order. From the previous discussion, the last three singular values will be zero or negligibly small compared to the others. Solving the problem at hand:

$$V = DW \qquad \text{eq. 51}$$

we get:

$$W = R \, \Sigma^{-1} \, U^T V \qquad \text{eq. 52}$$

where:
T denotes matrix transposition and $$\Sigma^{-1} = diag\left[\frac{1}{\sigma_1}, \frac{1}{\sigma_2} \cdots \frac{1}{\sigma_{3 \cdot NY-3}}, 0, 0, 0\right] \qquad \text{eq. 53}$$

So at this point we have a solution, W which gives us the components of reticle stage translation and yaw error (Equation 36.1).

Moving now to Block 4905 we remove the average values of translation and yaw from the completed solution.

$$TX = \frac{1}{NY} \sum_{IY=1}^{NY} TXRS(IY) \qquad \text{eq. 54}$$

$$TXRS(I) \rightarrow TXRS(I) - TX \qquad \text{eq. 55}$$

And similarly for TYRS (I) and QRS (I).

The final step (Block 4906) is to output a horizontal tab delimited file (FIG. 44) with the results of our computation.

Figure 45:
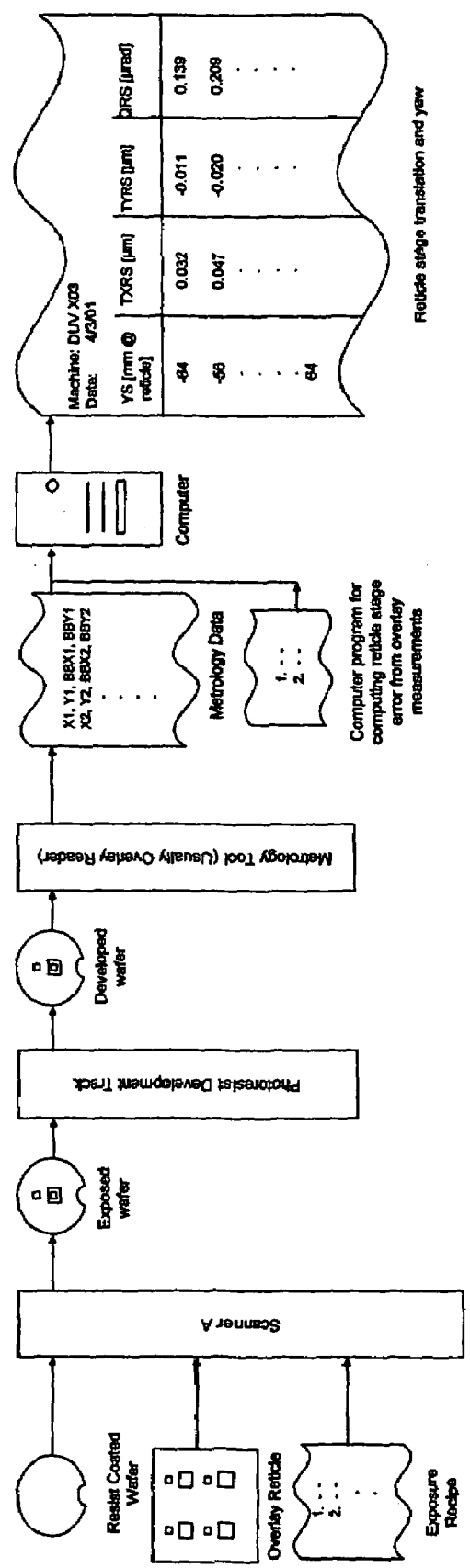
FIG. 45 illustrates the determination of reticle stage translation and yaw separately utilizing a scanner, overlay metrology tool and computer.
Figure 46:
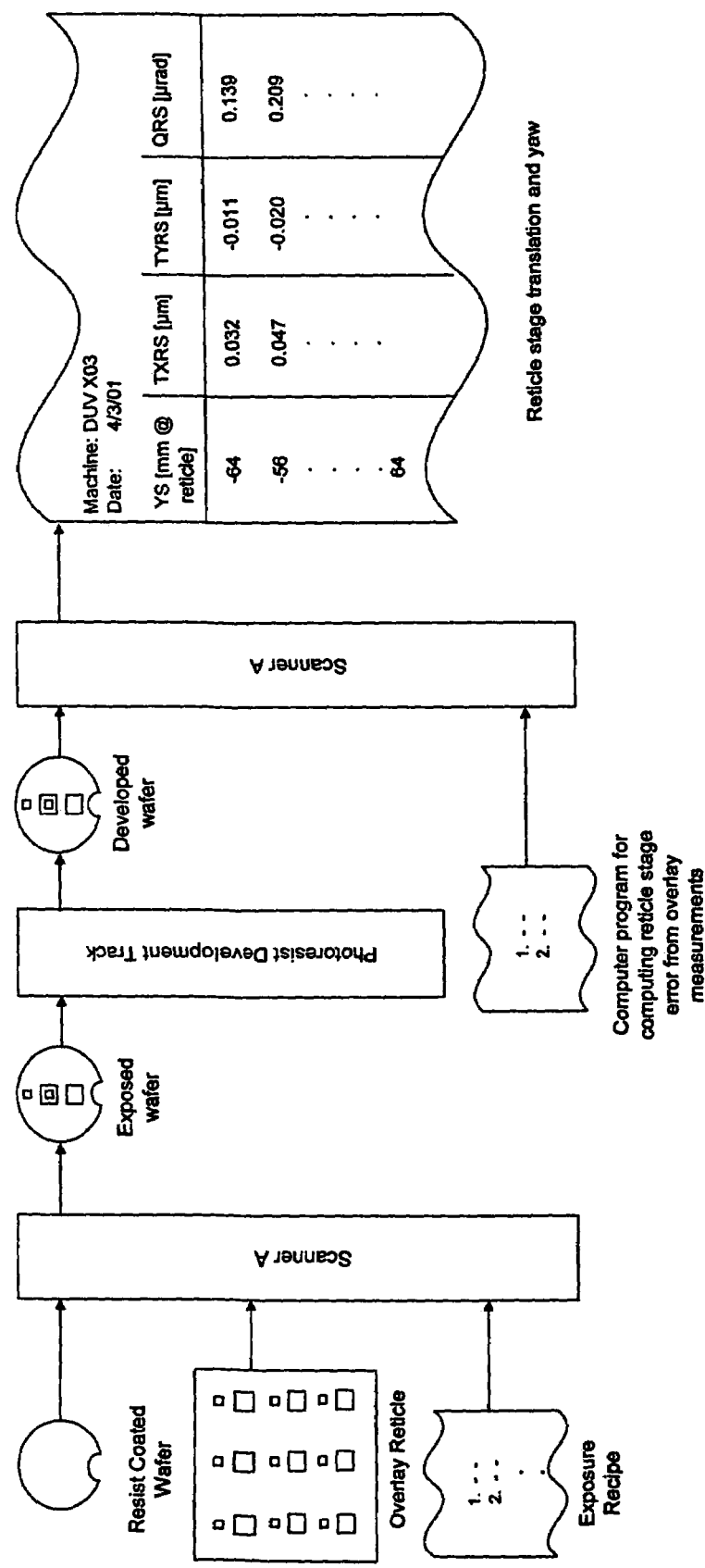
FIG. 46 illustrates a projection imaging tool that incorporates self-measurement of reticle stage grid and yaw.

FIG. 45 illustrates how reticle stage pitch and yaw are determined in the case that the scanner (scanner A), metrology tool, and computer are separate physical entities. This is the form in which this invention would most likely be deployed in fabs with a heterogeneous machine environment. For purposes of machine self-monitoring, the deployment illustrated in FIG. 46 could be used. There the exposed wafer is developed and sent back into scanner A and the overlay metrology done there. Said overlay metrology is typically either of the bar-in-bar or box-in-box type or utilizing the scanner wafer alignment system with pairs of wafer alignment marks as completed alignment attributes (see A, FIG. 2). In any case, the machine does the overlay measurements and uses a computer program (supra) resident on the machine to reconstruct its own reticle stage translation and yaw error.

Figure 47:
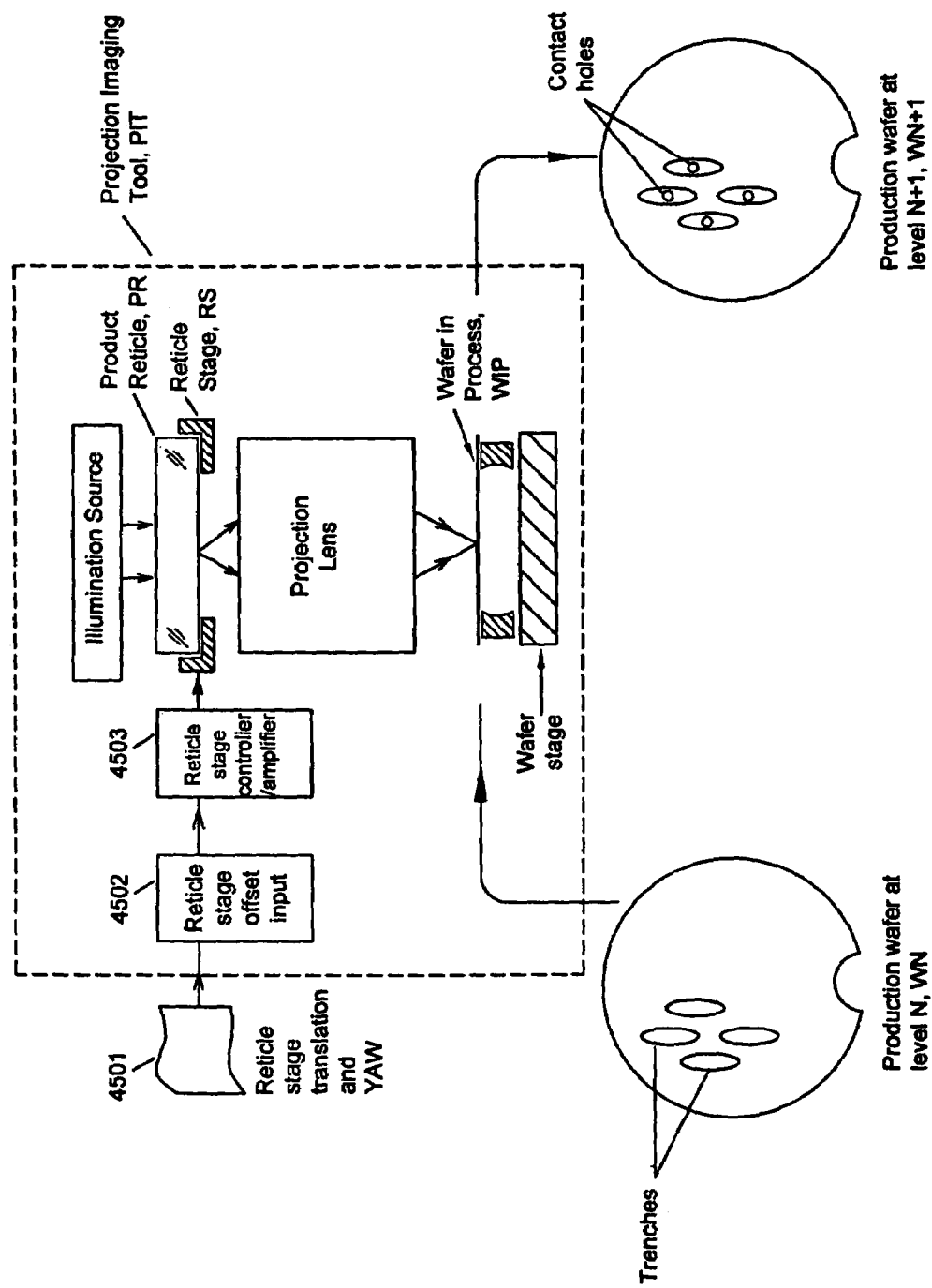
FIG. 47 illustrates application of reticle stage grid and yaw measurements to the improvement of chip manufacturing.

FIG. 47 illustrates the use of the techniques described above in the manufacture of integrated circuits. As illustrated in FIG. 47 a substrate (wafer W) with a recording media is loaded onto a projection imaging tool (PIT). Then a series of exposures are produced on the substrate in accordance with a production exposure sequence utilizing a product reticle, PR, and an exposure recipe, to produce an exposed substrate (wafer WN+1).

Figure 48:
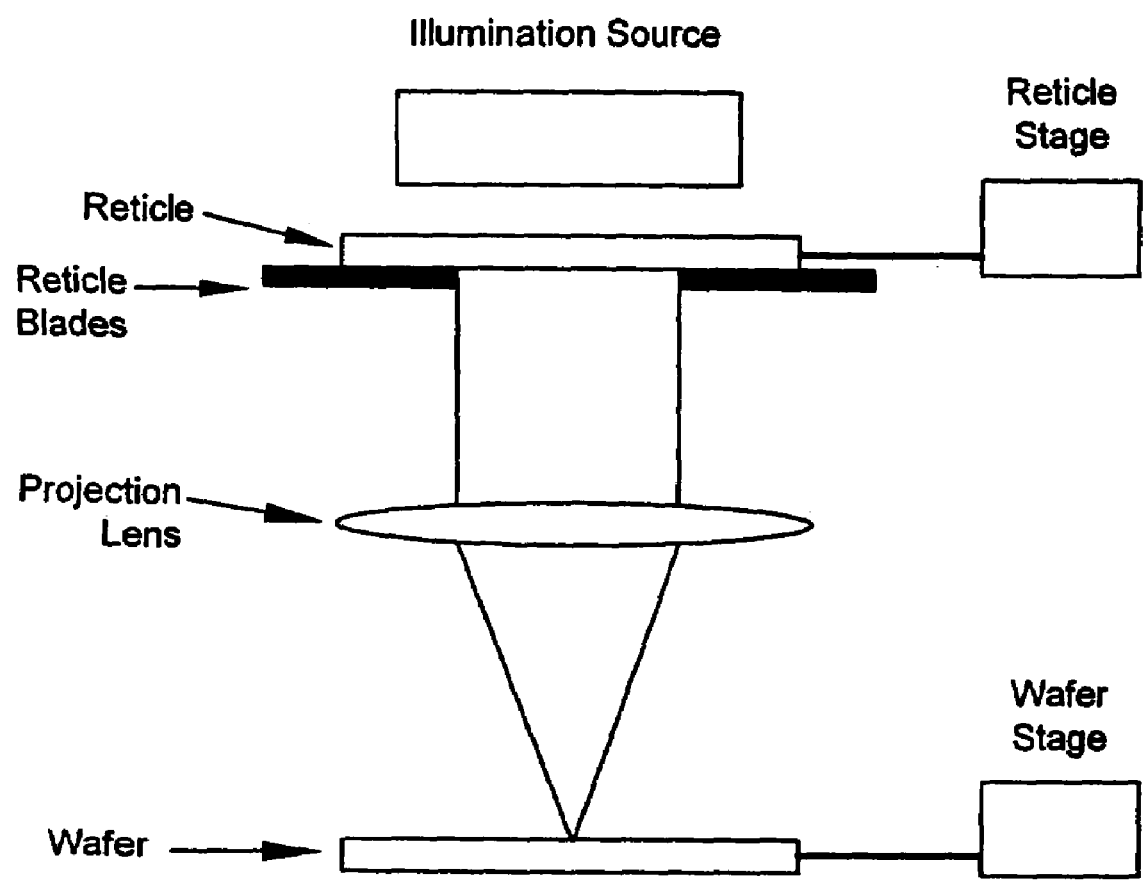
FIG. 48 is a block diagram illustrating portions of an exemplary projection imaging tool.

FIG. 48 is a block diagram illustrating portions of an exemplary projection imaging tool. As shown in FIG. 48, the exemplary projection imaging tool includes an illumination source. The illumination source projects an image of a reticle through a projection lens onto a wafer. The position of the reticle and wafer are controlled by reticle and wafer stages of the projection imaging tool. In addition, reticle blades control the portion of the reticle that is exposed onto the wafer.

The improvement to this process provided by the results of this invention involves taking the as determined reticle stage translation and yaw (Block 4701) and feeding it to the reticle stage offset input subfunction (Block 4702) which then determines the specific signal biases (analog or digital) needed by the reticle stage controller/amplifier (Block 4503) to alter the path of reticle stage RS so that in the present corrected state subsequent measurement of reticle stage translation and yaw by the method of this invention would give a substantially null result. This process improvement would manifest itself in improved overlay of features on product reticle PR (contact holes in FIG. 47) on product wafer features (trenches in FIG. 47).

Reticle Plate:

A portion of the reticle plate for an embodiment is shown in FIG. 21. There are no strict requirements on the size of the reticle plate, the shape of the overlay target patterns or the types of materials used to fabricate the mask plate. Many different overlay target patterns are available. See Handbook of Microlithography and Microfabrication, supra; Direct-Referencing Automatic Two-Points Reticle-to-Wafer Alignment Using a Projection Column Servo System, M. Van den Brink et al., SPIE Vol. 633, Optical Microlithography V, 60:71, 1986. The embodiments described will work with any photolithographic scanner system using any type of optical overlay targets. The accuracy of the measurement technique does depend on the overlay sampling density and this should be considered. In the preceding discussion it was considered that the reticle creating the overlay patterns was perfect. In practice this is not true, but errors in the reticle manufacture can be taken into account by first measuring the position of all the individual structures in all of the overlay groups using an absolute metrology tool such as the Nikon 5I, or Leica LMS 3200 series tools. Next, in formulating Equations 18–21, reticle error (divided by the photolithographic exposure tool demagnification) is explicitly written out on the right hand side and then subtracted from the resulting overlay measurements on the left hand side of the equations (thereby canceling out on the right hand side). The result is Equations 18–21 as they are written above but with a correction applied to the overlay measurements appearing on the left hand side.

Alternative Embodiments

In another embodiment, instead of the reticle illustrated in FIG. 21, a reticle layout as illustrated in FIG. 35 can be used. As illustrated in FIG. 35, each reticle set consists of an Mx×My array of alternating inner and outer box columns on regular pitch M*p". This reticle would be used in the same way as the reticle mentioned in the previous embodiment. Another variation of the reticle includes the double reticle set shown in FIG. 36. Each reticle consists of an Mx×My array of inner and outer box targets on regular pitch M*p". To use this reticle set, the photolithographic scanner is programmed to expose reticle 1 first and use reticle 2 for the final X and R shear exposures.

The reticles are typically made of glass with openings defined in a chrome coating. This is common for projection lithography tools utilized in semiconductor manufacture. The form the reticle can take will be determined by the format required by the specific projection lithography tool on which the reticle is loaded.

Overlay metrology tools utilized are typically conventional optical overlay tools such as those manufactured by KLA-Tencor (See KLA 5105 Overlay Brochure, KLA-Tencor; KLA 5200 Overlay Brochure, KLA-Tencor) or Bio-Rad Semiconductor Systems. See Quaestor Q7 Brochure, Bio-Rad Semiconductor Systems. Other optical overlay tools that can be used as well, include those described in Process for Measuring Overlay Misregistration During Semiconductor Wafer Fabrication, I. Mazor et al., U.S. Pat. NO. 5,438,413, Aug. 1, 1995. In addition, some steppers or scanners (See Matching Management of Multiple Wafer Steppers Using a Stable Standard and a Matching Simulator, supra) can utilize their wafer alignment systems and wafer stages to function as overlay tools. However, the total size of the alignment attribute would be limited (consisting of 2 wafer alignment marks) to a distance over which the wafer stage would be as accurate as a conventional optical overlay tool. This distance is typically less than about 0.5 mm.

When electrical alignment attributes are used for overlay (See Matching Management of Multiple Wafer Steppers Using a Stable Standard and a Matching Simulator, supra; Automated Electrical Measurements of Registration Errors in Step and Repeat Optical Lithography Systems, supra; Capacitor Circuit Structure for Determining Overlay Error, supra), the overlay metrology tool utilized would correspond to the electrical equipment utilized for making the corresponding measurement.

The embodiments described above have been mainly described with respect to their application on projection imaging tools (scanners See Micrascan™ III Performance of a Third Generation, Catadioptric Step and Scan Lithographic Tool, D. Cote et al., SPIE Vol. 3051, 806:816, 1997; ArF Step and Scan Exposure System for 0.15 Micron and 0.13 Micron Technology Node; J. Mulkens et al., SPIE Conference on Optical Microlithography XII, 506:521, March 1999; 0.7 NA DUV Step and Scan System for 150 nm Imaging with Improved Overlay, J. V. Schoot, SPIE Vol. 3679, 448:463, 1999) commonly used in semiconductor manufacturing. The techniques and methods can be applied to other scanning projection tools such as; 2-dimensional scanners (See Large-area, High-Throughput, High-Resolution Projection Imaging System, K. Jain, U.S. Pat. No. 5,285,236, Feb. 8, 1994; Optical Lithography—Thirty Years and Three Orders of Magnitude, supra), office copy machines, and next generation lithography (ngl) systems such as XUV (See Development of XUV Projection Lithography at 60–80 nm, supra), SCALPEL, EUV (Extreme Ultra Violet) (See Reduction Imaging at 14 nm Using Multi-player-Coated Optics: Printing of Features Smaller than 0.1 Micron, supra), IPL (Ion Projection Lithography), and EPL (electron projection lithography) See Mix-and-Match: A Necessary Choice, supra.

The techniques have been described with respect to the recording medium being positive photoresist. The techniques would work equally well with negative photoresist, providing appropriate adjustment to the box in box structures on the reticle are made. In general, the recording medium can be any recording media that is used on the lithographic projection tool being measured. For example, on an EPL tool, an electron beam photoresist such as PMMA could be utilized as the recording medium.

In the embodiments above, the substrates on which the recording media is placed were described as wafers. This will be the case in semiconductor manufacture. The techniques described will work on other forms of substrate, with the exact form of the substrate dictated by the projection lithography tool and it's use in a specific manufacturing environment. For example, in a flat panel manufacturing facility, the substrate on which the photoresist would be placed would be a glass plate or panel. A mask making tool would utilize a reticle as a substrate. Circuit boards or multi-chip module carriers are other possible substrates.

The present invention has been mainly described with respect to it's application on the projection imaging tools (scanners (See Micrascan™ III Performance of a Third Generation, Catadioptric Step and Scan Lithographic Tool, D. Cote et al., SPIE Vol. 3051, 806:816, 1997; ArF Step and Scan Exposure System for 0.15 Micron and 0.13 Micron Technology Node, J. Mulkens et al., SPIE Conference on Optical Microlithography XII, 506:521, March 1999; 0.7 NA DUV Step and Scan System for 150 nm Imaging with Improved Overlay, J. V. Schoot, SPIE Vol. 3679, 448:463, 1999) commonly used in semiconductor manufacturing today. The methods of the present invention can be applied to other scanning projection tools such as; 2-dimensional scanners (See Large-Area, High-Throughput, High Resolution Projection Imaging System, Jain, U.S. Pat. No. 5,285, 236, Feb. 8, 1994; Optical Lithography—Thirty Years and Three Orders of Magnitude, supra), office copy machines, and next generation lithography (ngl) systems such as XUV (See Development of XUV Projection Lithography at 60–80 nm, B. Newnam et al., SPIE Vol. 1671, 419:436, 1992), SCALPEL, EUV (Extreme Ultra Violet) (See Reduction Imaging at 14 nm Using Multilayer-Coated Optics: Printing of Features Smaller than 0.1 Micron, J. Bjorkholm et al., Journal Vacuum Science and Technology, B 8(6), 1509: 1513, November/December 1990), IPL (Ion Projection Lithography), and EPL (electron projection lithography). See Mix-and Match: A Necessary Choice, supra.

The present invention has been mainly described with respect to the recording medium being positive photoresist. The present invention could equally well have used negative photoresist providing we make appropriate adjustment to the overlay groups on the reticle. In general, the recording medium is whatever is typically used on the lithographic projection tool we are measuring. Thus, on an EPL tool, an electron beam photoresist such as PMMA could be utilized as the recording medium.

So far, we have described the substrates on which the recording media is placed as wafers. This will be the case in semiconductor manufacture. The exact form of the substrate will be dictated by the projection lithography tool and it's use in a specific manufacturing environment. Thus, in a flat panel manufacturing facility, the substrate on which the photoresist would be placed would be a glass plate or panel. A mask making tool would utilize a reticle as a substrate. Circuit boards or multi-chip module carriers are other possible substrates.

The foregoing description details certain embodiments of the invention. It will be appreciated, however, that no matter how detailed the foregoing appears, the invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes, which come with the meaning and range of equivalency of the claims, are to be embraced within their scope.

The invention claimed is:

1. A method of operating a projection imaging tool, the method comprising:

positioning a substrate with a recording media in a desired location;

exposing a first portion of a reticle pattern onto a substrate with a recording media thereby producing a first exposure, wherein the first exposure of the portion of the reticle pattern includes at least two arrays of alignment attributes, the arrays of alignment attributes having features complementary to each other and the arrays having the same pitch and being offset from each other;

shifting a reticle stage in a desired direction by a desired amount;

exposing a second portion of the reticle pattern onto the substrate thereby producing a second exposure, the second exposure pattern being essentially the same as the first exposure pattern, wherein the shifting of the reticle stage between the first and the second exposure aligns the first and second exposures such that alignment attributes in the second exposure overlap and interlock with alignment attributes in the first exposure thereby creating completed alignment attributes;

measuring positional offsets of the completed alignment attributes; and determining the reticle stage portion of a synchronization error.

2. A method as defined in claim 1, wherein the reticle stage portion of the synchronization error comprises grid and yaw error.

3. A method as defined in claim 1, further comprising repeating shifting the reticle stage and exposing additional portions of the reticle to produce a desired number of completed alignment attributes.

4. A method as defined in claim 1, wherein exposing a portion of a reticle comprises blades that cover a portion of a reticle.

5. A method as defined in claim 1, wherein the substrate is a semiconductor surface, a silicon wafer, a flat panel display, a reticle, a photolithographic mask, or an electronic recording media.

6. A method as defined in claim 1, wherein the projection imaging tool is used in a photolithographic stepper system, a photolithographic scanner system, an electronic beam imaging system, an extreme ultra-violet photolithographic tool, or an x-ray imaging system.

7. A method as defined in claim 1, wherein the recording media is a negative resist material, a positive resist material, an electronic CCD, a liquid crystal material, or an optically sensitive material.

8. A method as defined in claim 1, wherein the reticle further comprises a reduced transmission material.

9. A method as defined in claim 1, wherein the reticle further comprises an attenuated phase shift mask.

10. A method as defined in claim 1, wherein producing an exposure comprises a plurality of sub nominal exposures.

11. A method of manufacturing integrated circuits using a projection imaging tool, the method comprising:

exposing a first portion of a reticle pattern onto a substrate with a recording media thereby producing a first exposure, wherein the first exposure of the first portion of the portion of the reticle pattern includes at least two arrays of alignment attributes, the arrays of alignment attributes having features complementary to each other and the arrays have the same pitch and are offset from each other;

shifting a reticle stage in a desired direction by a desired amount;

exposing a second portion of the reticle pattern onto the substrate thereby producing a second exposure, the second exposure being essentially the same as the first exposure of the portion of the reticle pattern, wherein the shifting of the reticle stage aligns the first and second exposures such that alignment attributes in the second exposure overlap and interlock with alignment attributes in the first exposure thereby creating completed alignment attributes;

measuring positional offsets of the completed alignment attributes;

determining the reticle stage portion of a synchronization error; and adjusting operation of the projection imaging tool in accordance with the determined reticle stage portion of the synchronization error.

12. A method as defined in claim 11, wherein the reticle stage portion of the synchronization error comprises grid and yaw error.

13. A method of controlling a projection imaging tool, the method comprising:

exposing a first portion of a reticle pattern onto a substrate with a recording media thereby producing a first exposure, wherein the first exposure of the first portion of the portion of the reticle pattern includes at least two arrays of alignment attributes, the arrays of alignment attributes having features complementary to each other and the arrays having the same pitch and being offset from each other;

shifting a reticle stage in a desired direction by a desired amount;

exposing a second portion of the reticle pattern onto the substrate thereby producing a second exposure, the second exposure being essentially the same as the first portion of the reticle pattern, wherein the shifting of the reticle stage aligns the first and second exposures such that alignment attributes in the second exposure overlap and interlock with alignment attributes in the first exposure thereby creating completed alignment attributes;

measuring positional offsets of the completed alignment attributes;

determining the reticle stage portion of a synchronization error; and controlling operation of the reticle stage in accordance with the determined reticle stage grid and yaw.

14. A method as defined in claim 13, wherein the reticle stage portion of the synchronization error comprises grid and yaw error.

15. A method of determining a reticle stage grid and yaw in a projection imaging tool having a reticle, the method comprising:

exposing a reticle pattern onto a substrate having a recording media in a first position, wherein the reticle pattern includes at least two arrays of alignment attributes, the arrays of alignment attributes having features complementary to each other and the arrays have the same pitch and are offset from each other;

exposing the reticle pattern onto the substrate in a second position, wherein the reticle pattern in the second position overlaps the reticle pattern in the first position and is shifted in a direction having a component perpendicular to a scanning direction by an amount that corresponds to the array offset;

rotating the substrate a desired angular amount and exposing the reticle pattern onto the substrate in a third position, wherein the reticle pattern in the third position overlaps the reticle pattern in the first position;

measuring positional offsets of the alignment attributes of the overlapped exposed patterns on the substrate; and determining a reticle stage grid and yaw from the positional offset measurements.

* * * * *